(12) United States Patent
Chen et al.

(10) Patent No.: US 9,929,217 B2
(45) Date of Patent: Mar. 27, 2018

(54) ARRAY SUBSTRATE OF DISPLAY AND METHOD OF MANUFACTURING THE SAME

(71) Applicant: AU Optronics Corporation, Hsin-Chu (TW)

(72) Inventors: Hong-Syu Chen, Hsin-Chu (TW);
Wen-Pin Chen, Hsin-Chu (TW);
Teng-Ke Chen, Hsin-Chu (TW);
Tsu-Wei Chen, Hsin-Chu (TW);
Kuo-Kuang Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/007,654

(22) Filed: Jan. 27, 2016

(65) Prior Publication Data
US 2017/0213871 A1    Jul. 27, 2017

(51) Int. Cl.
*H01L 27/32* (2006.01)
*H01L 51/56* (2006.01)
*H01L 51/00* (2006.01)

(52) U.S. Cl.
CPC ........ *H01L 27/322* (2013.01); *H01L 27/3211* (2013.01); *H01L 27/3246* (2013.01); *H01L 51/0005* (2013.01); *H01L 51/56* (2013.01); *H01L 2227/323* (2013.01)

(58) Field of Classification Search
CPC .................................................. H01L 27/3246
See application file for complete search history.

(56) References Cited

U.S. PATENT DOCUMENTS

| | | | |
|---|---|---|---|
| 7,288,420 B1 | 10/2007 | Yamazaki et al. | |
| 7,893,440 B2 | 2/2011 | Kwon et al. | |
| 7,948,171 B2 | 5/2011 | Sakakura et al. | |
| 8,242,683 B2 | 8/2012 | Abe et al. | |
| 8,535,975 B2 | 9/2013 | Kim et al. | |
| 8,674,365 B2 | 3/2014 | Ku et al. | |
| 8,816,579 B2 | 8/2014 | Kim | |
| 2005/0280002 A1* | 12/2005 | Kang | H01L 27/3248 257/72 |
| 2007/0181879 A1* | 8/2007 | Lee | H01L 27/3246 257/59 |
| 2011/0198598 A1* | 8/2011 | Kim | H01L 27/3246 257/59 |
| 2014/0139102 A1 | 5/2014 | Jeon et al. | |

FOREIGN PATENT DOCUMENTS

| | | |
|---|---|---|
| JP | 2007044582 A | 2/2007 |
| TW | 447145 | 7/2001 |
| TW | 201308705 | 2/2013 |

\* cited by examiner

*Primary Examiner* — Shuan Campbell
*Assistant Examiner* — Aneta Cieslewicz
(74) *Attorney, Agent, or Firm* — WPAT, PC

(57) ABSTRACT

A method of manufacturing an array substrate of a display is provided. The method includes forming a first bank material layer on a first substrate, wherein a material of the first bank material layer includes hydrophobic element; patterning the first bank material layer to form a first bank having at least one first concave; forming a first electrode on the first bank and in the first concave after the step of patterning the first bank material layer to form the first bank; and forming an color layer on the first electrode.

12 Claims, 32 Drawing Sheets

ARRAY SUBSTRATE OF DISPLAY AND METHOD OF MANUFACTURING THE SAME

TECHNICAL FIELD

The present invention relates to a method of manufacturing an array substrate, and more particularly to an array substrate of a display.

BACKGROUND OF THE INVENTION

Organic light emitting diode display and liquid crystal display are widely used for televisions, monitors mobile phones, etc. FIG. 1 is an equivalent circuit of a pixel of a conventional organic light emitting diode display. As shown on FIG. 1, pixel P includes a data line DL, a scan line SL, a switch thin film transistor ST, a driving thin film transistor DT, and an organic light emitting diode EM, a power line PL and a common line GD. The switch thin film transistor ST is electrically connected with the scan line SL and the data line DL. The driving thin film transistor DT is electrically connected with the switch thin film transistor ST and the power line PL. The organic light emitting diode EM includes anode, cathode and organic emitting layer disposed therebetween. The anode and the cathode of the organic light emitting diode EM are respectively electrically connected with drain of the driving thin film transistor DT and the common line GD, for respectively receiving power signal transmitted from the power line PL and ground voltage transmitted from the common line GD so as to drive the organic emitting layer to generate light. Additionally, capacitor C is formed between the drain of the switch thin film transistor ST and the drain of the driving thin film transistor DT.

In a method of manufacturing the organic light emitting diode display, deposition and develop-etch-strip processes are utilized many times to sequentially form the films of organic light emitting diode display. However, undesired problems may be occurred. For example, if the organic emitting layer has uneven thickness or is of bad uniformity, device properties and light efficiency may be worse, fast device degradation and short lifetime may happen accordingly.

As for the liquid crystal display field, the liquid crystal display includes an array substrate, a color filter and a liquid crystal layer disposed therebetween. Specifically, when a color filter-on-array (COA) technology is applied, the liquid crystal display includes a COA substrate, an opposite substrate and a liquid crystal layer disposed therebetween. In a method of manufacturing the COA type liquid crystal display, deposition and develop-etch-strip processes are utilized many times to sequentially form the films of thin film transistors, bank and the color filter layers. Similar to the problems mentioned above, if the color filter layers have uneven thickness or is of bad uniformity, light efficiency or liquid crystal efficiency may be worse.

SUMMARY

In order to overcome the above mentioned problems, the purpose of the present invention is to provide a method of manufacturing an array substrate to have a color layer of even thickness and uniform distribution in the pixel area.

In one embodiment, a method of manufacturing an array substrate comprises forming a first bank material layer on a first substrate, wherein a material of the first bank material layer comprises hydrophobic element; patterning the first bank material layer to form a first bank having at least one first concave; forming a first electrode on the first bank and in the first concave after the step of patterning the first bank material layer to form the first bank; and forming a color layer on the first electrode.

In one embodiment, the method further comprises forming a second bank material layer on the first electrode before the step of forming the color layer, wherein a material of the second bank material layer comprises hydrophilic element; patterning the second bank material layer to form a second bank having at least one second concave; and forming a second electrode on the organic emission layer, wherein the organic emission layer is located in the second concave.

In one embodiment, the method further comprises forming a driving thin film transistor on the first substrate before the step of forming the first bank material layer on the first substrate; and disposing a mask above the first bank material layer located on the driving thin film transistor, wherein the step of patterning the first bank material layer is utilizing the mask to remove a portion of the first bank material layer to form the at least one first concave and a contact hole located above a source of the driving thin film transistor.

In one embodiment, the second concave is completely within the first concave for example, and wherein a horizontal distance between an edge of the second concave and that of the first concave is about 3 micrometer to about 5 micrometer.

In one embodiment, a method of manufacturing an array substrate comprises forming a first bank on a first substrate having at least one first concave; forming a second bank material layer on the first bank and within the first concave, wherein a material of the second bank material layer comprises hydrophilic element; patterning the second bank material layer to form a second bank having at least one second concave; forming a first electrode on the first bank and in the first concave and the second concave; and forming a color layer on the first electrode.

In one embodiment, an array substrate comprises a first substrate, a first bank, having at least one first concave, formed on the first substrate, wherein a material of the first bank comprises hydrophobic element, a first electrode formed on the first bank and in the first concave, and a color layer formed on the first electrode.

BRIEF DESCRIPTION OF THE DRAWINGS

The disclosure can be more fully understood by reading the following detailed description of the embodiments, with reference to the accompanying drawings as follows.

The present invention relates to improving the thickness uniformity of a color layer of an array substrate, and more particularly to a method of manufacturing an array substrate.

In the following description, several specific details are presented to provide a thorough understanding of the embodiments of the present invention. One skilled in the relevant art will recognize, however, that the present invention can be practiced without one or more of the specific details, or in combination with or with other components.

Figure 1:
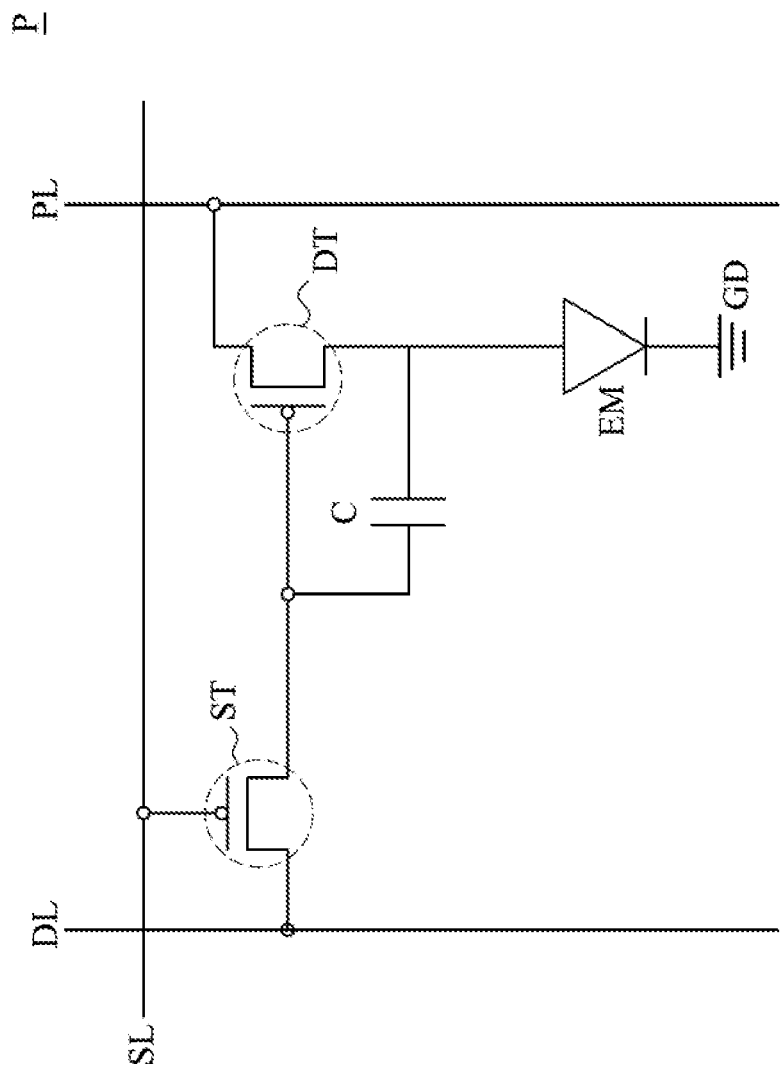
FIG. 1 is an equivalent circuit of a pixel of a conventional organic light emitting diode display.
Figure 2A:
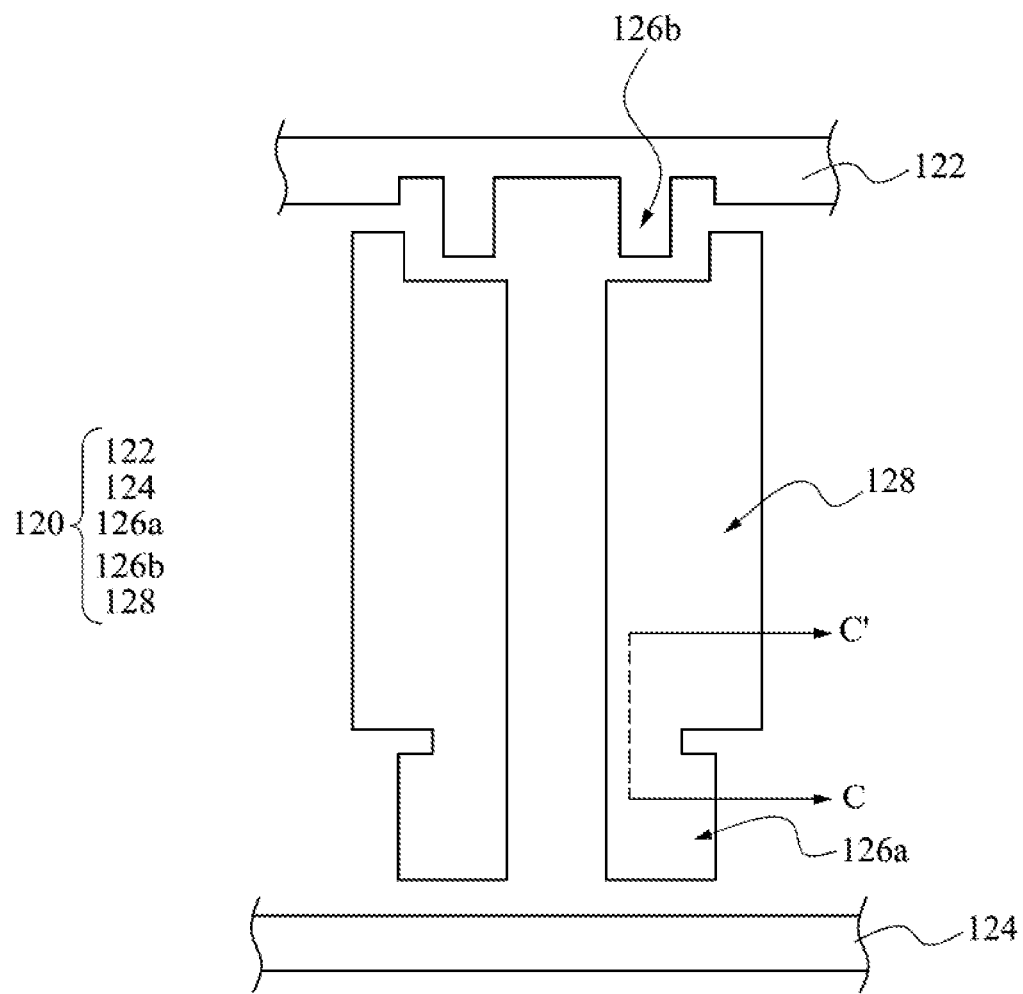
FIG. 2A to FIG. 10C are schematic cross-section views and representative corresponding top views of two pixels of the array substrate of an organic light emitting diode display of the process flow illustrating the manufacturing method of the preferred embodiment of the present invention.
Figure 2B:
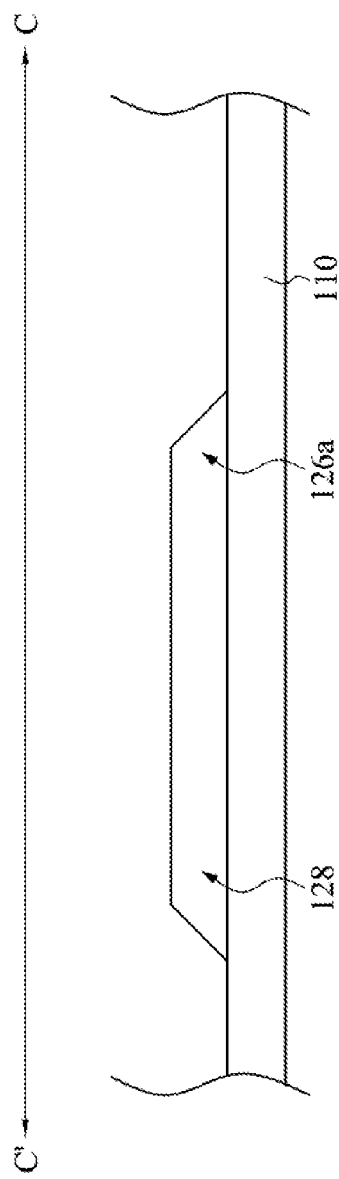
Figure 3:
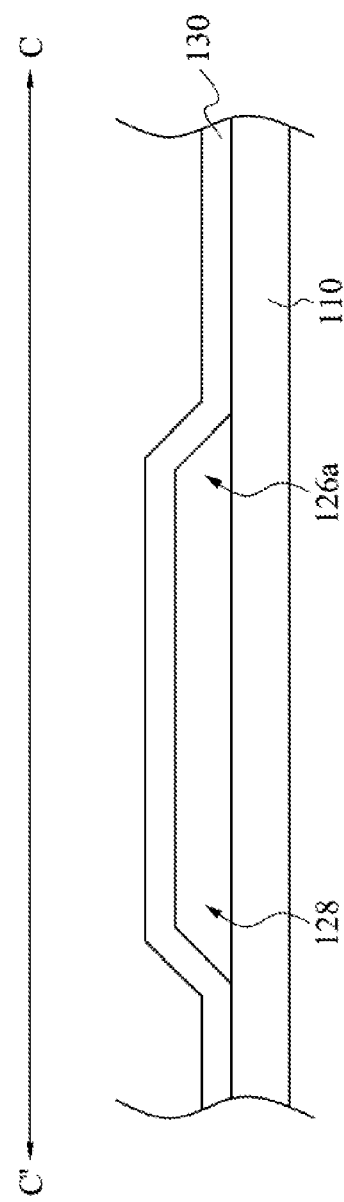

FIG. 2A to FIG. 10 are schematic cross-section views and representative corresponding top views of two pixels of the array substrate of an organic light emitting diode display of the process flow illustrating the manufacturing method of the preferred embodiment of the present invention. For purposes of explanation and illustration, and not limitation, only two sub-pixels and corresponding areas are shown. The array substrate has more than two sub-pixels. Firstly, with reference to FIG. 2A and FIG. 2B, and FIG. 2B is the cross-section view of FIG. 2A along the line C-C'. Form a patterned first conductive layer 120 on the first substrate 110. The material of the patterned first conductive layer 120 comprises metal, metal oxide or other suitable materials. The patterned first conductive layer 120 may have single layer or multi-layers. The patterned first conductive layer 120 includes scan line 122, power line 124, gate 126a of the driving thin film transistor, gate 126b of the switch thin film transistor, and a first capacitor electrode 128. The first capacitor electrode 128 is electrically connected with the gate 126a. Then, with reference to FIG. 3, form the gate insulating layer 130 on the patterned first conductive layer 120.

Figure 4A:
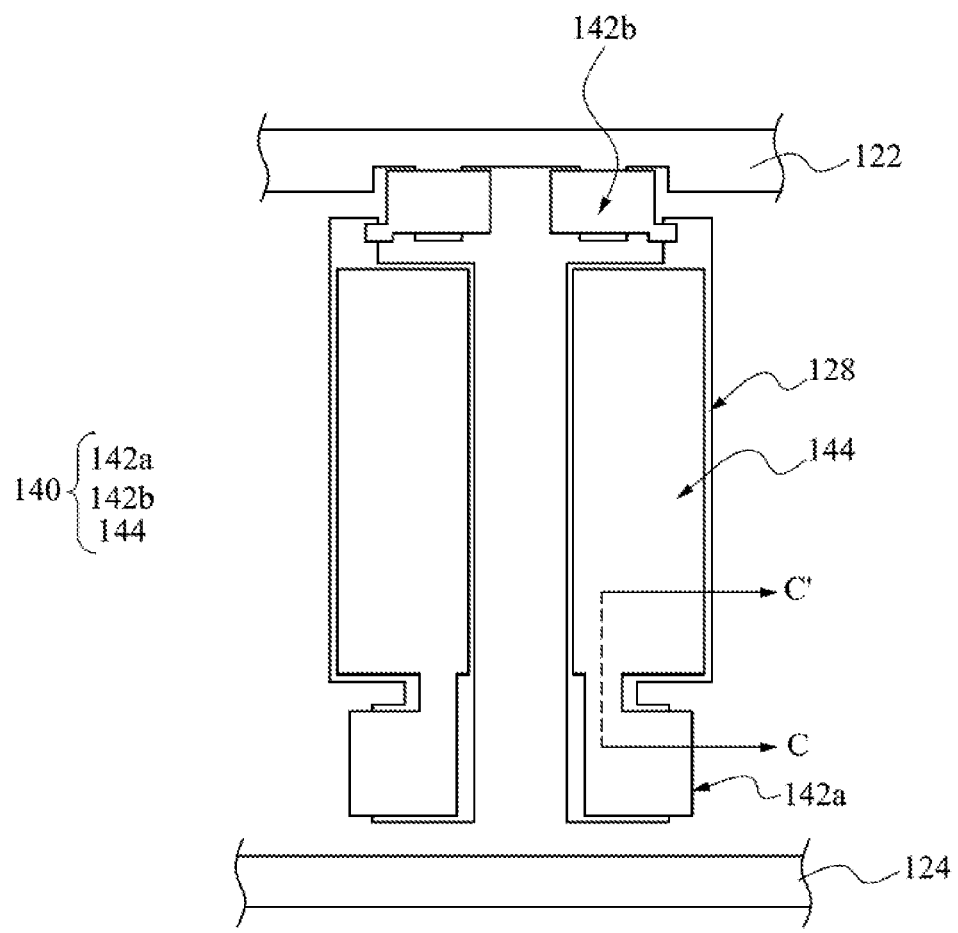
Figure 4B:
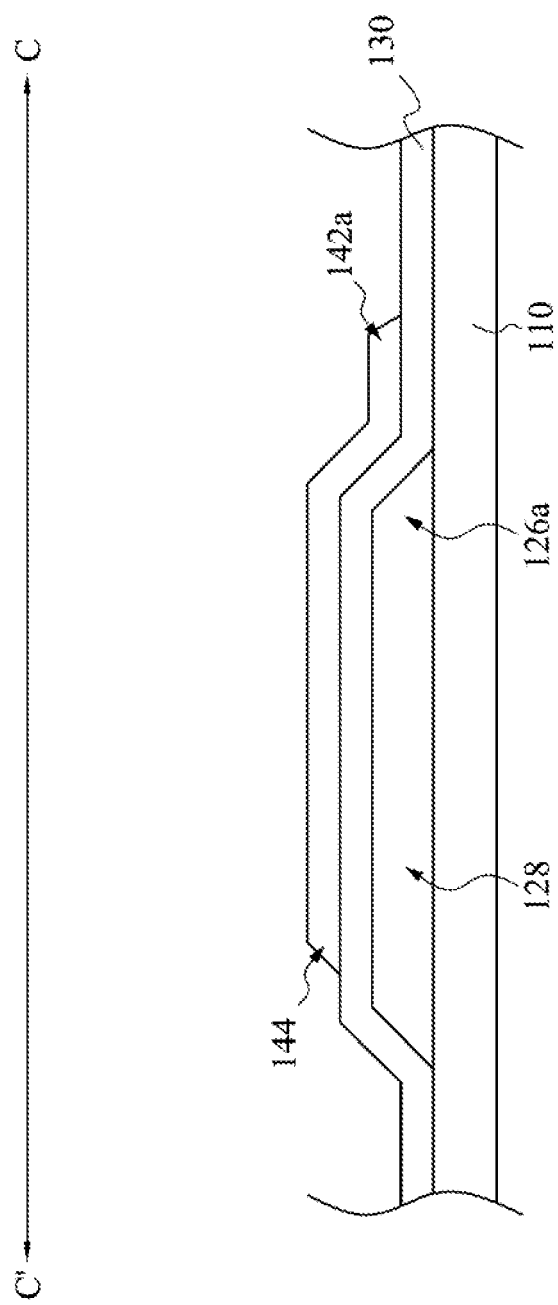

Thereafter, with reference to FIG. 4A and FIG. 4B, FIG. 4B is the cross-section view of FIG. 4A along the line C-C'. Form the patterned active layer 140 on the gate insulating layer 130. The material of the patterned active layer 140 comprises Indium gallium zinc oxide (IGZO), amorphous silicon, poly-silicon or other suitable semi-conductive materials. The patterned active layer 140 may have single layer or multi-layers. The patterned active layer 140 includes channel layer 142a of the driving thin film transistor, channel layer 142b of the switch thin film transistor and second capacitor electrode 144. The second capacitor electrode 144 is electrically connected with the channel layer 142a. Selectively, the second capacitor electrode 144 may be omitted depending upon other design requirements.

Figure 5A:
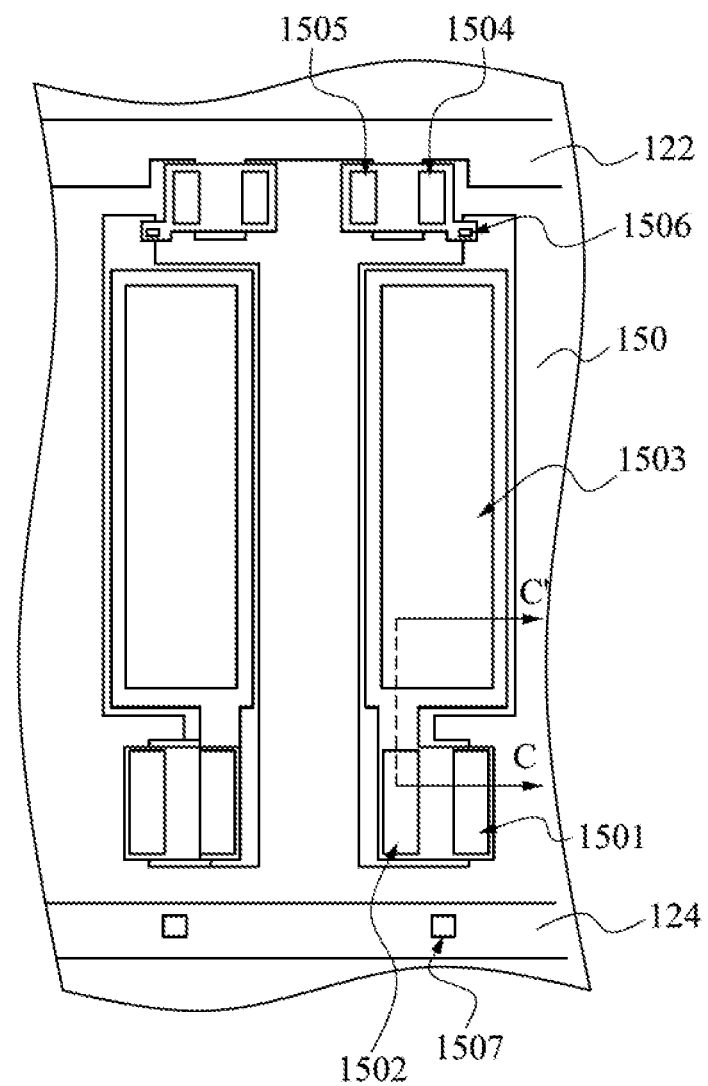
Figure 5B:
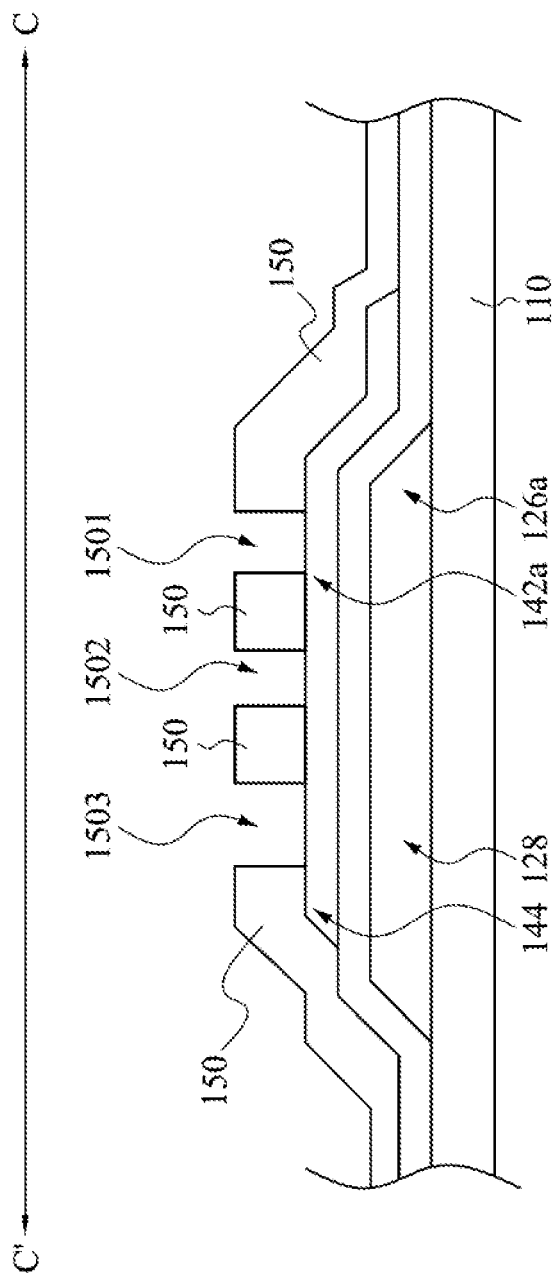

Then, as shown in FIG. 5A and FIG. 5B, FIG. 5B is the cross-section view of FIG. 5A along the line C-C'. Form the patterned etch-stop layer 150 on the patterned active layer 140. The patterned etch-stop layer 150 has the first opening 1501 and the second opening 1502 to expose a portion of the channel layer 142a, the third opening 1503 to expose a portion of the second capacitor electrode 144, the fourth opening 1504 and the fifth opening 1505 to expose a portion of the channel layer 142b, the sixth opening 1506 to expose another portion of the second capacitor electrode 144, and the seventh opening 1507 to expose a portion of the patterned active layer 140 only located above and overlapping with the power line 124. For clear observation, in FIG. 5A, only first opening 1501, the second opening 1502, the third opening 1503, the fourth opening 1504, the fifth opening 1505, sixth opening 1506 and seventh opening 1507 are shown and marked, and the solid portion of the patterned etch-stop layer 150 are not colored.

Figure 6A:
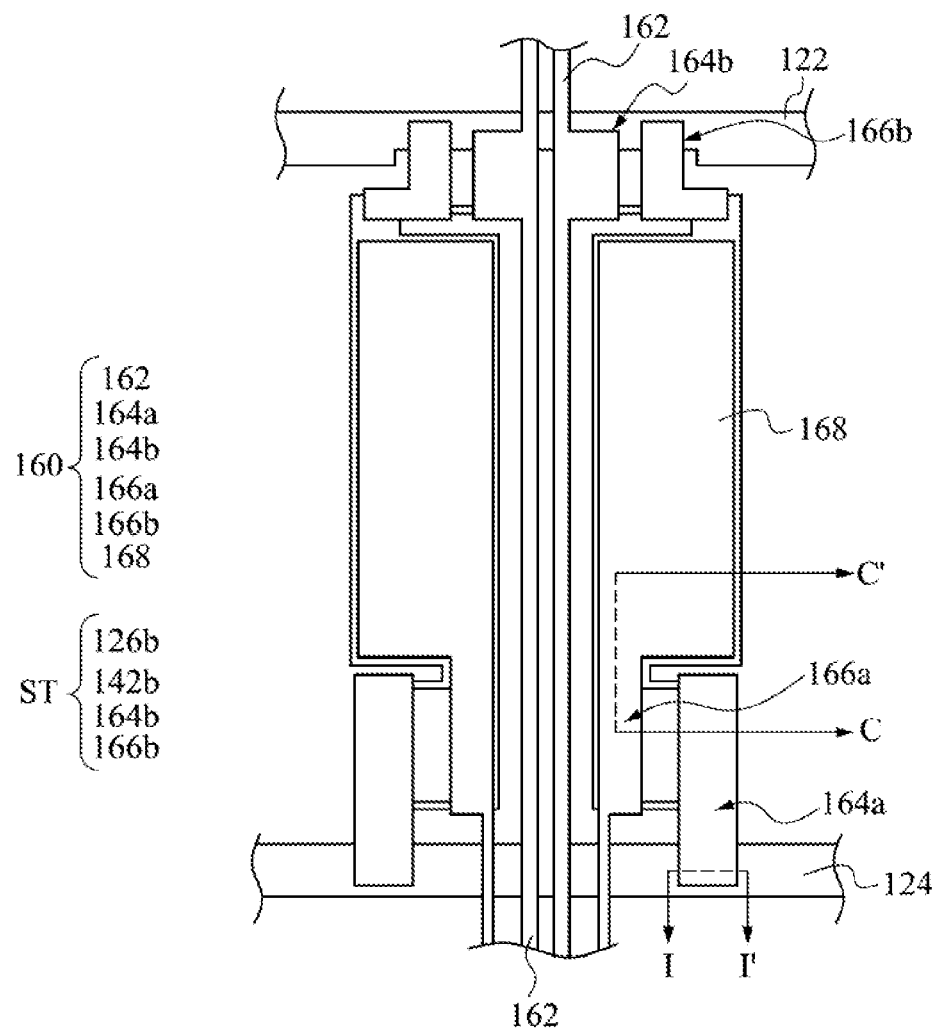
Figure 6B:
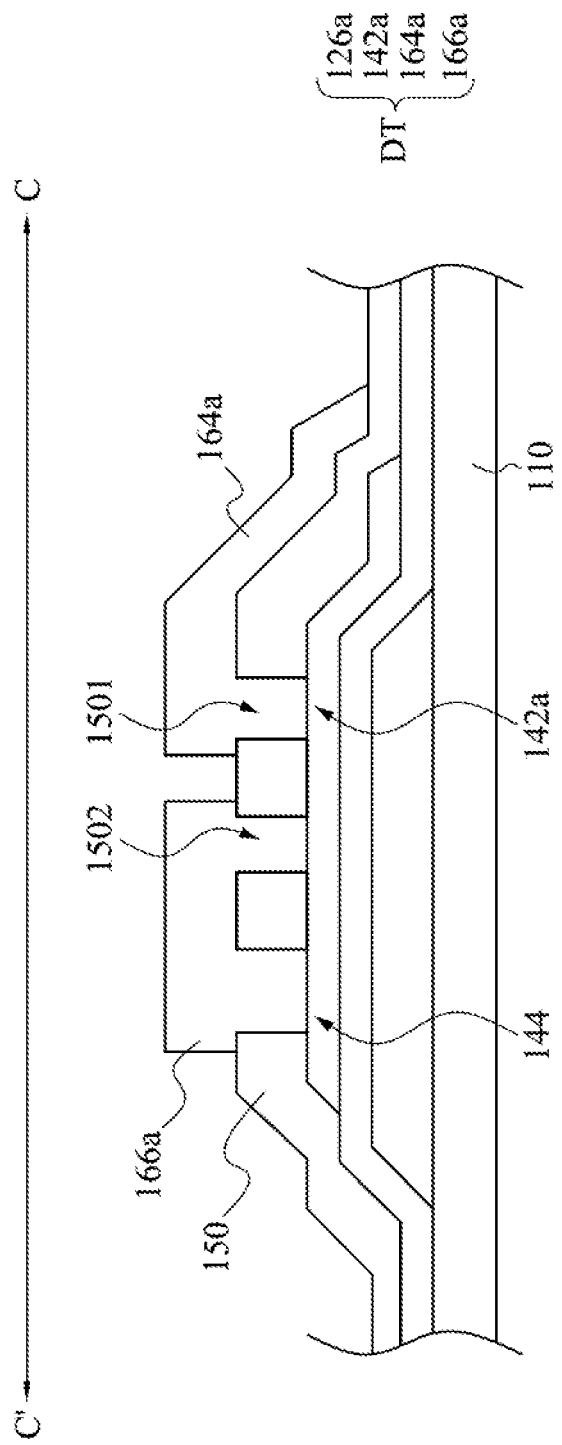

After that, with reference to FIG. 6A and FIG. 6B, FIG. 6B is the cross-section view of FIG. 6A along the line C-C'. For purpose of explanation and clear observation, and not limitation, in the present step, the patterned active layer 140 and solid portion of the patterned etch-stop layer 150 are not shown in FIG. 6A. Form the patterned second conductive layer 160 on the patterned etch-stop layer 150. The material of the patterned second conductive layer 160 comprises metal, metal oxide or other suitable materials. The patterned second conductive layer 160 may have single layer or multi-layers. The patterned second conductive layer 160 includes data line 162, source 164a and drain 166a of the driving thin film transistor DT, source 164b and drain 166b of the switch thin film transistor ST, and the third capacitor electrode 168. The source 164b is directly connected with the data line 162, for example. In the present embodiment, the source 164a is electrically connected with the channel layer 142a through the opening 1501. The drain 166a is electrically connected with the channel layer 142a through the opening 1502. The source 164b is electrically connected with the channel layer 142b through the opening 1505. The drain 166b is electrically connected with the channel layer 142b through the opening 1504. In the present step, the switch thin film transistor ST and the driving thin film transistor DT are formed completely. The driving thin film transistor DT includes gate 126a, channel layer 142a, source 164a and drain 166a. The switch thin film transistor ST includes gate 126b, channel layer 142b, source 164b and drain 166b.

Figure 6C:
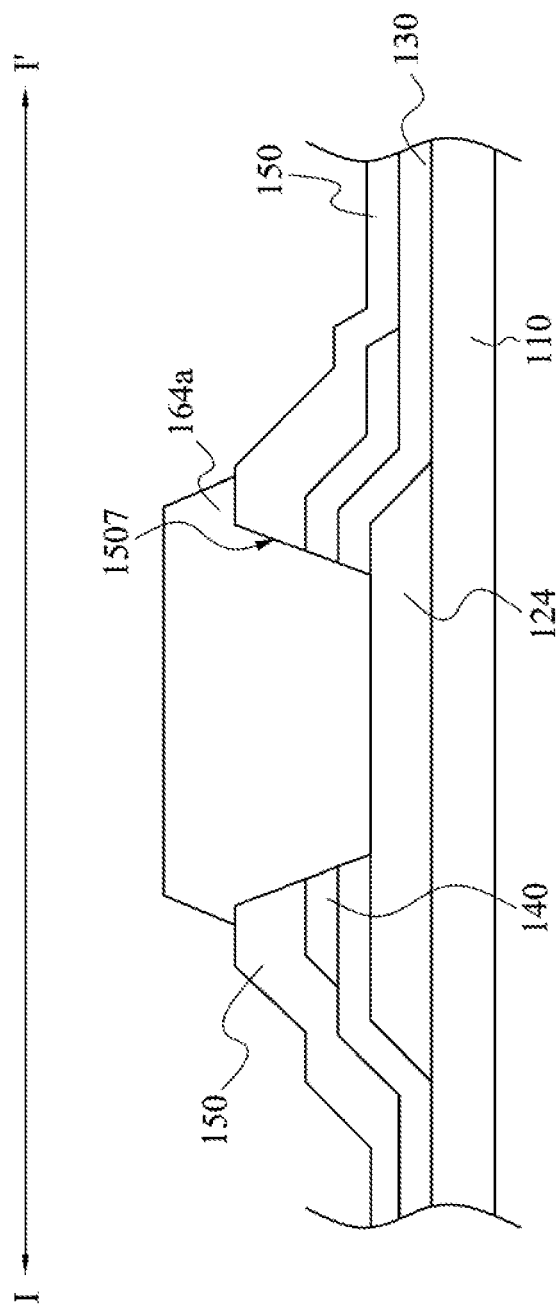
Figure 6D:
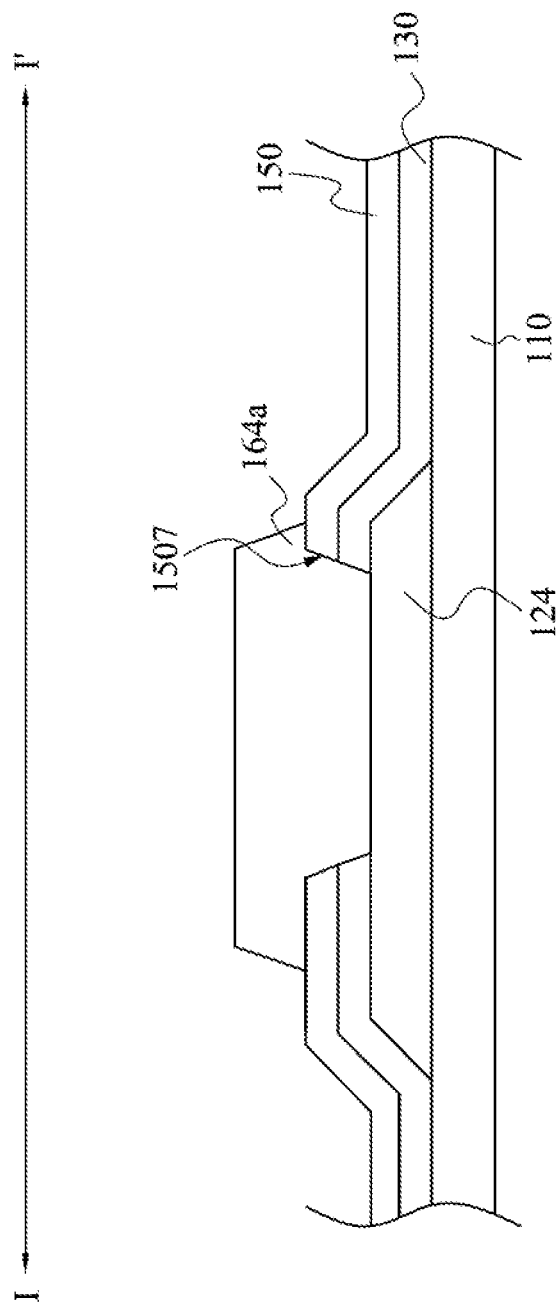

FIG. 6C is the cross-section view of FIG. 6A along the line I-I' according to one embodiment of the present invention. FIG. 6D is the cross-section view of FIG. 6A along the line I-I' according to another one embodiment of the present invention. As shown in FIG. 6C, the source 164a of the driving thin film transistor DT is electrically connected with the power line 124 so that the power signal is transmitted to the source 164a. Specifically, the gate insulating layer 130, the portion of the patterned active layer 140 and the portion of the patterned etch-stop layer 150 together have a through hole (not marked) including the opening 1507 to expose a portion of the power line 124, and via the mentioned above through hole, the source 164a of the driving thin film transistor DT is electrically connected with the power line 124. In FIG. 6D, the connection structure according to another one embodiment has only one difference from that of FIG. 6C, the portion of the patterned active layer 140 in FIG. 6C is omitted. That is, in the step of forming the patterned active layer 140, the patterned active layer 140 is not overlapped with the power line 124, the following formed opening 1507, and/or the source 164a of the driving thin film transistor DT.

After the mentioned above steps, the so-called thin film transistor array of an organic light emitting diode display of the present embodiment is formed. The thin film transistor array comprises scan lines, data lines, switch thin film transistors, driving thin film transistors and power lines.

Figure 7A:
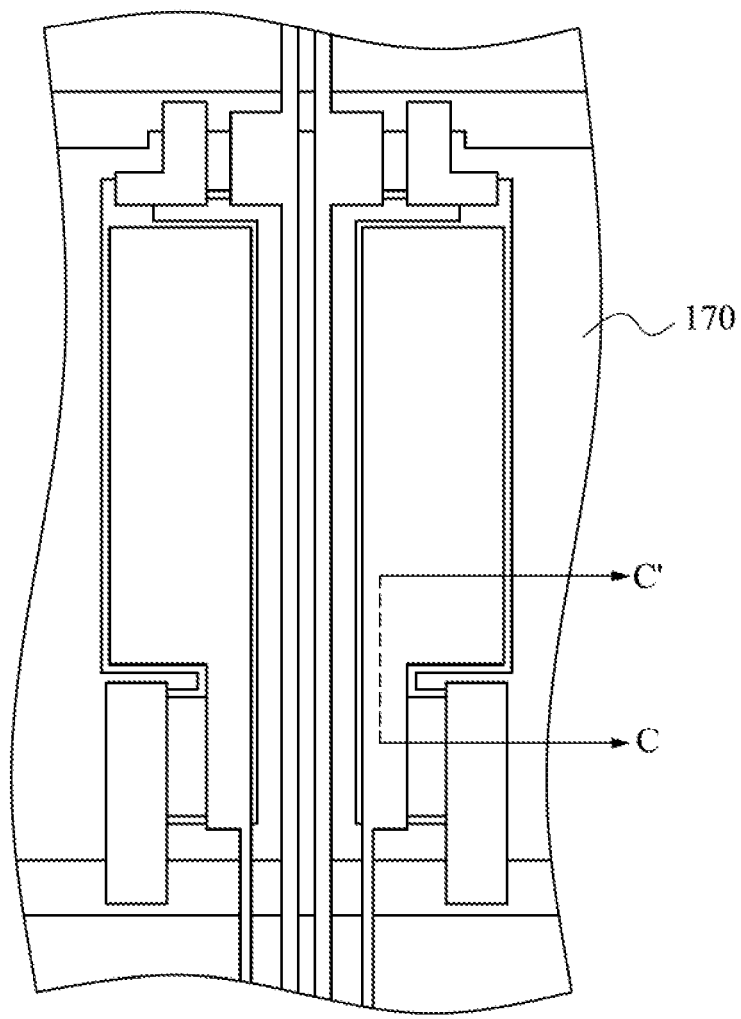
Figure 7B:
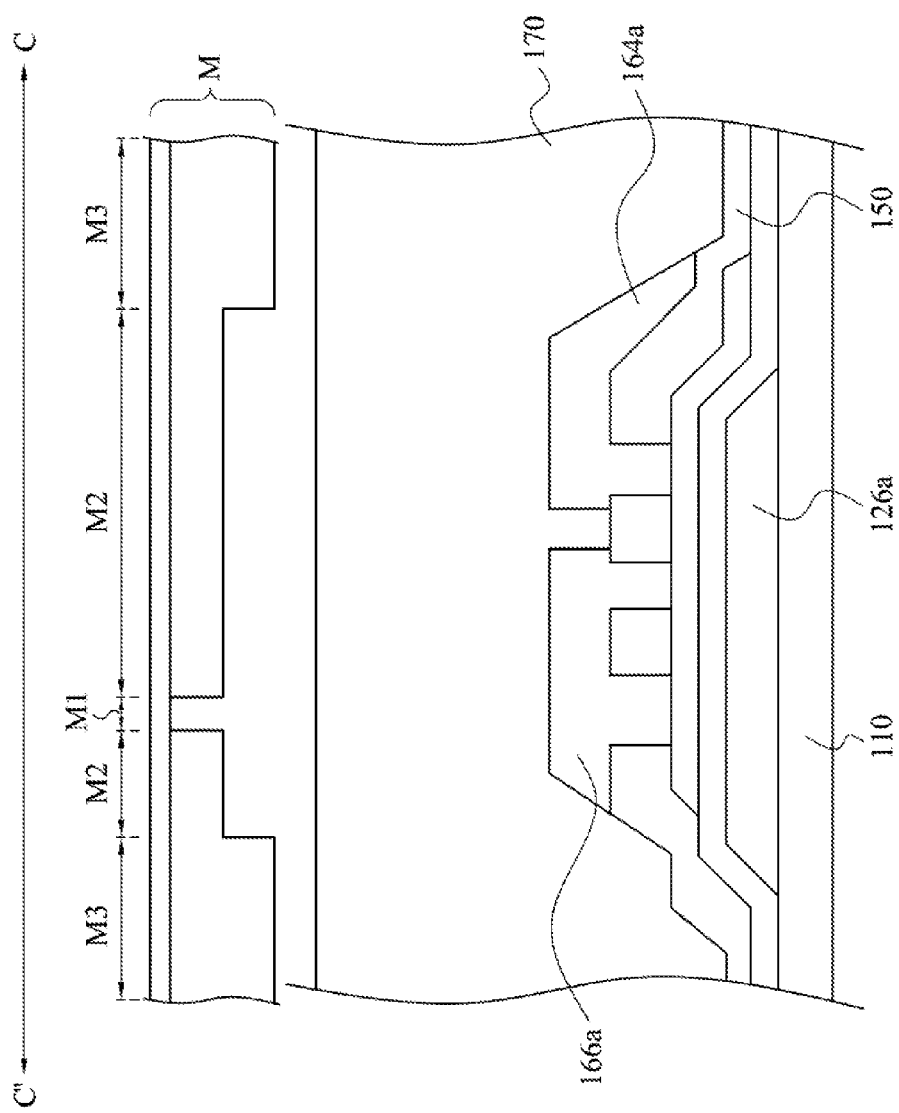

Then, with reference to FIG. 7A and FIG. 7B, FIG. 7B is the cross-section view of FIG. 7A along the line C-C'. Form the first bank material layer 170 on the thin film transistor array. In order to define the sub-pixel areas properly, the material of the first bank material layer 170 comprises hydrophobic element and organic material, and the detail description will be illustrated in the following paragraphs. The hydrophobic element may be fluorine. The organic material comprises positive photoresist or negative photoresist. Dispose a mask M above the first bank material layer 170. The mask M is a half-tone mask or a grey-tone mask, for example. The mask M has a first portion M1 corresponding to the drain 166a of the driving thin film transistor DT, a second portion M2 substantially surrounding the first portion M1, and a third portion M3 substantially surrounding the second portion M2. The first light transmittance T1 of the first portion M1 is higher than the second light transmittance T2 of the second portion M2. The second light transmittance T2 of the second portion M2 is higher than the third light transmittance T3 of the third portion M3. Please with reference to FIG. 7C, pattern the first bank material layer 170 to form the first concave 1720 and the contact hole 1722. The contact hole 1722 exposes a portion of the drain 166a of the driving thin film transistor DT. In detail, the step of patterning the first bank material layer 170 by utilizing the mask M to remove a portion of the first bank material layer 170 to form the first bank 172. The first bank 172 has the first concave 1720 corresponding to sub-pixel region.

Figure 7C:
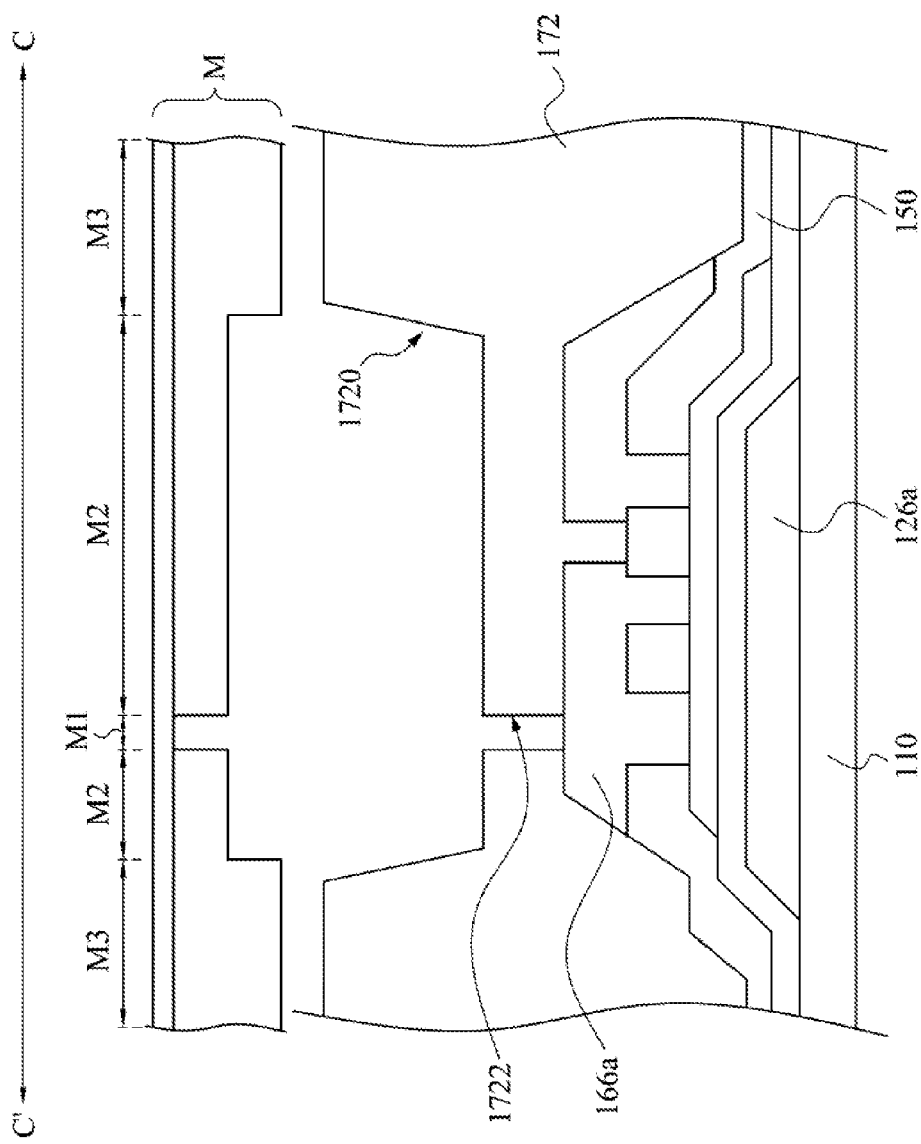
Figure 7D:
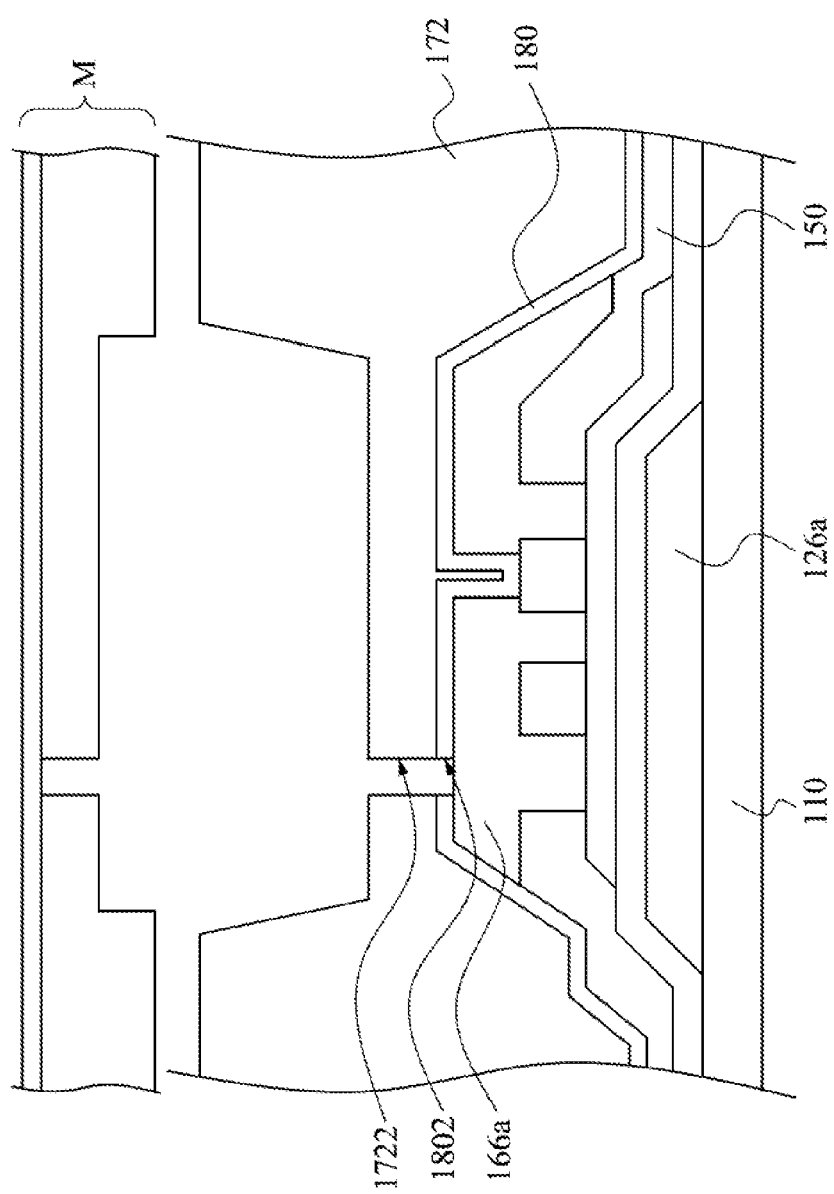

FIG. 7D is a manufacturing method of one embodiment of the present invention. The differences from FIG. 7C is, before the step of forming the first bank material layer 170 on the first substrate 110 and after the step of forming the thin film transistor array of an organic light emitting diode display, form the passivation layer (not marked) on the driving thin film transistor DT, and then pattern the passivation layer to form the patterned passivation layer 180 having an opening 1802 to expose the drain 166a. The material of the passivation layer comprises 8-hydroxyquinolinate aluminium (Alq), silicon oxide, silicon nitride, for example. After the step of forming the opening 1802, form the first bank material layer 170 on the patterned passivation layer 180. The opening 1802 and the contact hole 1722 are overlapped with each other and connected with each other. However, the embodiment is not limited thereto. Alternatively, after the step of forming the passivation layer (not marked), sequentially form the first bank material layer 170 on the passivation layer. After that, simultaneously pattern the first bank material layer 170 and the passivation layer by utilizing same mask to simultaneously form the first concave 1720, the contact hole 1722 and the opening 1802. The contact hole 1722 and the opening 1802 together form a through hole to expose the drain 166a. The horizontal cross-section area of the contact hole 1722 and that of the opening 1802 are substantially the same, for example.

The first concaves 1720 are corresponding to sub-pixel regions respectively. The sub-pixels may be red, green, blue or white sub-pixels. Because the first bank 172 has hydrophobic property, the subsequent formed color layer would not overflow the corresponding sub-pixel regions thereby the color mixture problem can be prevented or the possibility thereof may be reduced.

Figure 8A:
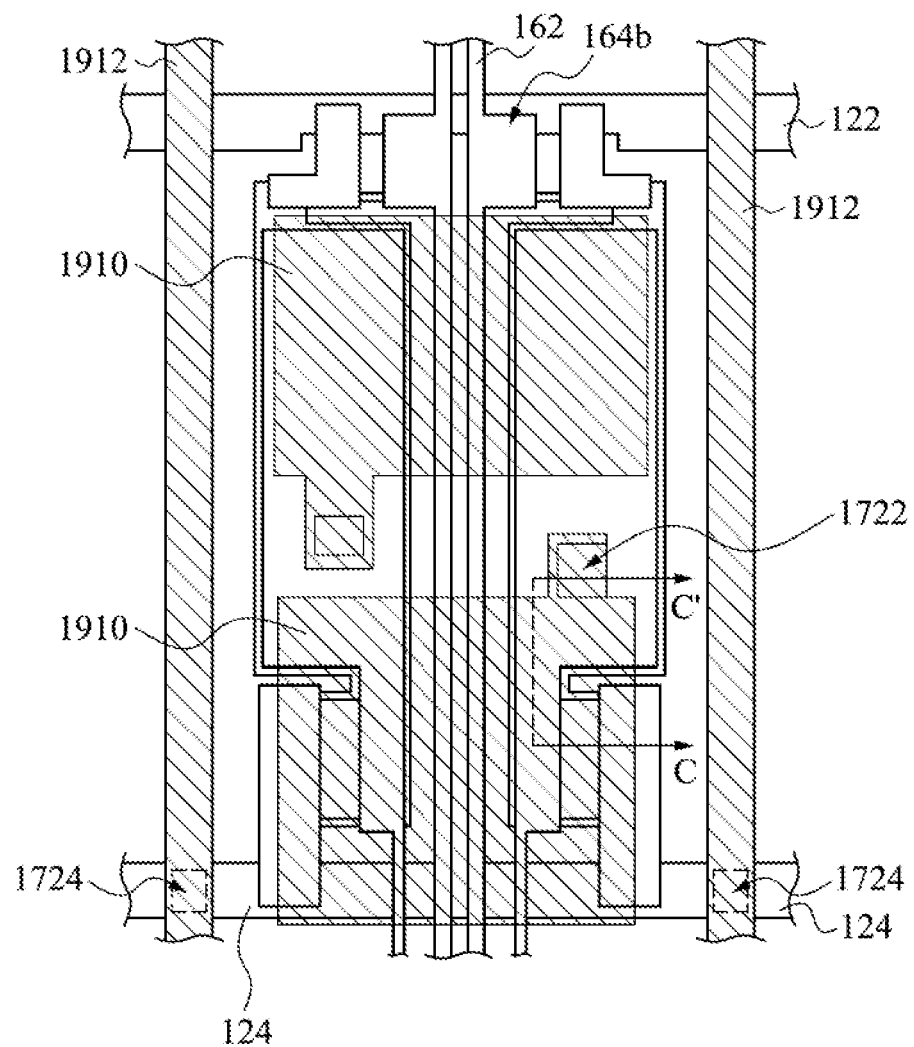
Figure 8B:
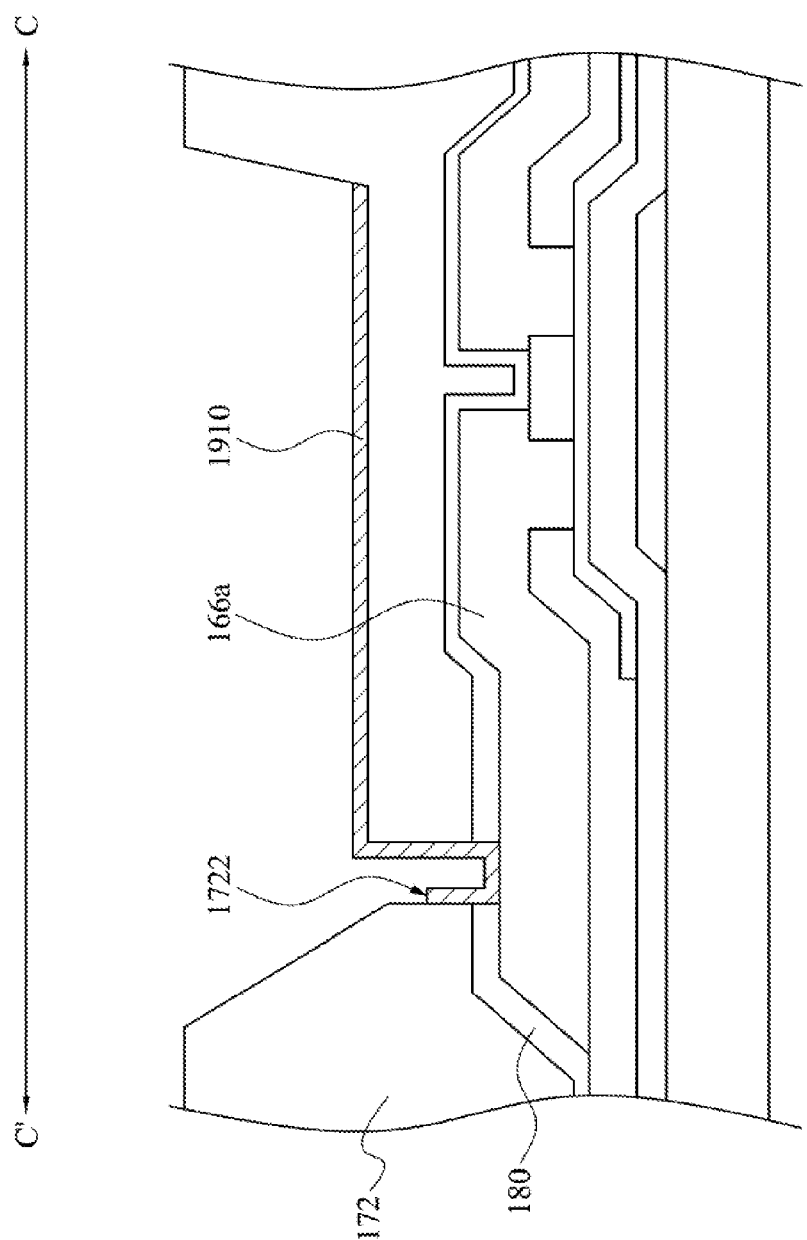

Thereafter, with reference to FIG. 8A and FIG. 8B, and for purpose of explanation and clear observation, and not limitation, some elements not shown in FIG. 8A, form the first electrode 1910 and selectively form the auxiliary line 1912 on the first bank 172. The material of the first electrode 1910 comprises, aluminium Neodymium (AlNd), Indium Tin Oxide (ITO), Titanium (Ti), Aluminium (Al), or silver (Ag), for example. The first electrode 1910 and the auxiliary line 1912 may be formed by patterning same conductive layer and have same material. A portion of the first electrode 1910 is in the first concave contact hole 1722 to be electrically connected with the drain 166a of the driving thin film transistor DT. The power line 124 and the auxiliary line 1912 are electrically connected with each other by through hole 1724 so that power signal is transmitted sequentially through the auxiliary line 1912 and the power line 124 to the drain 166a, for example. However, there is not limited thereto, the power signal may be transmitted to the power line 124 from other signal line located in the fanout area, rather than from the auxiliary line 1912.

Figure 9A:
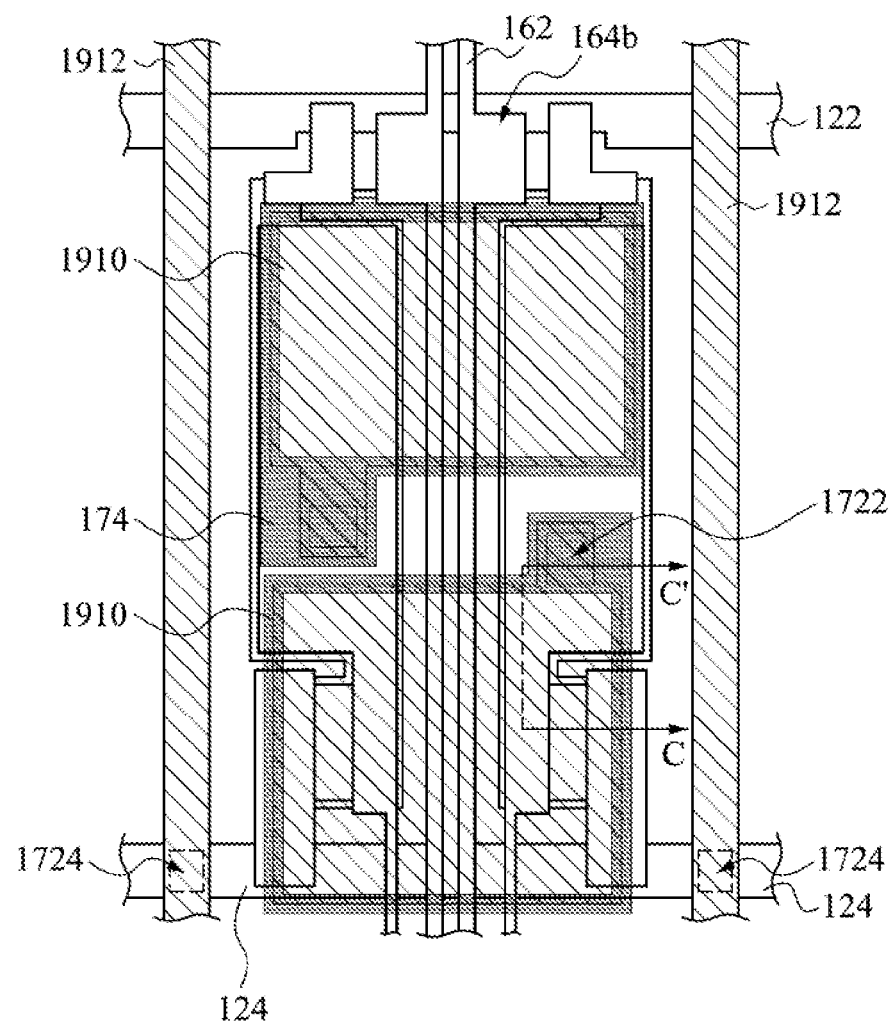
Figure 9B:
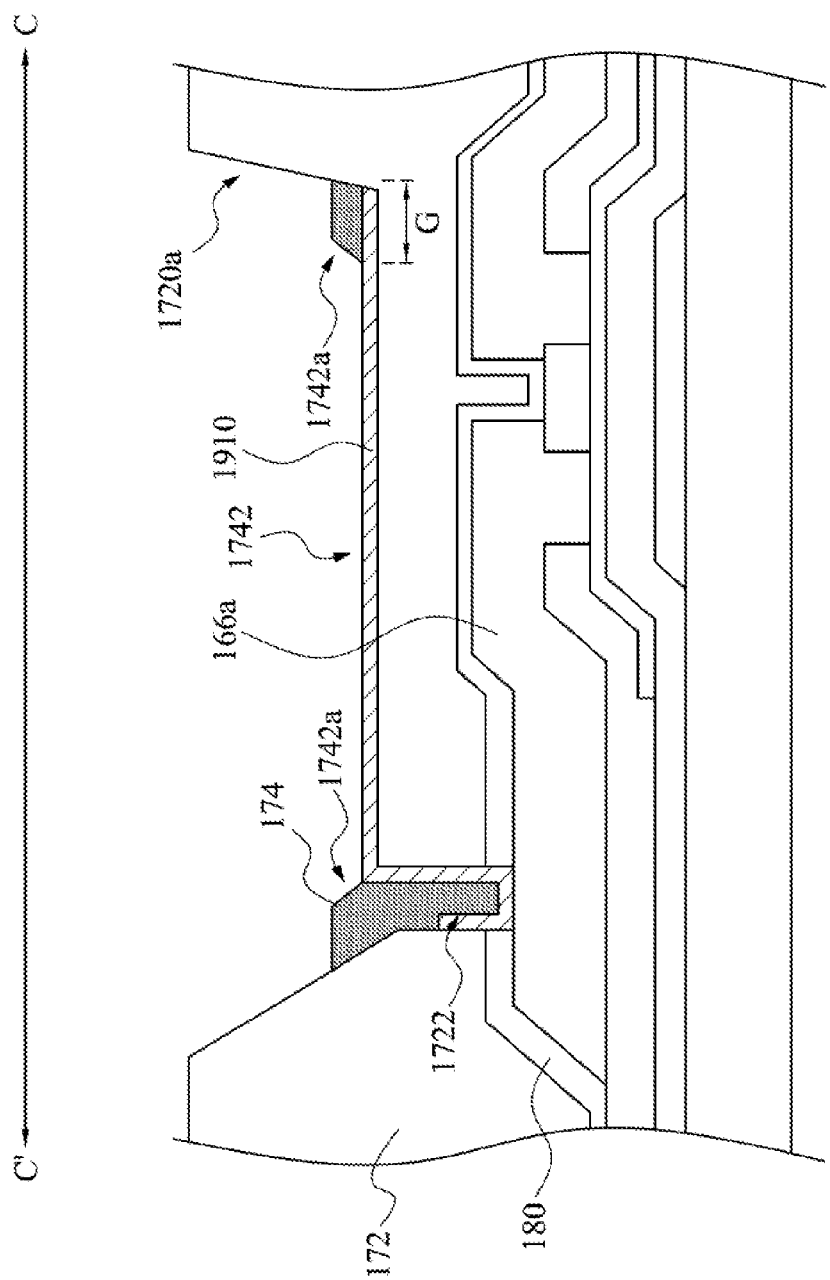

FIG. 9B is the cross-section view of FIG. 9A along the line C-C'. After the first electrode 1910 is formed, form the second bank material layer (not marked) on the first electrode 1910. The material of the second bank material layer comprises hydrophilic element. As shown in FIG. 9A, pattern the second bank material layer to form the second bank 174. The second bank 174 may include a shape of rectangle or circle, but not limited thereto. The second bank 174 has a second concave 1742 which is completely within the first concave 1720, for example. With reference to FIG. 9B, horizontal distance G between the edge 1742a of the second concave 1742 and the edge 1720a of the first concave 1720 is about 3 micrometers to about 5 micrometers. The width of the second bank 174 is about 3 micrometers to about 5 micrometers.

Figure 10A:
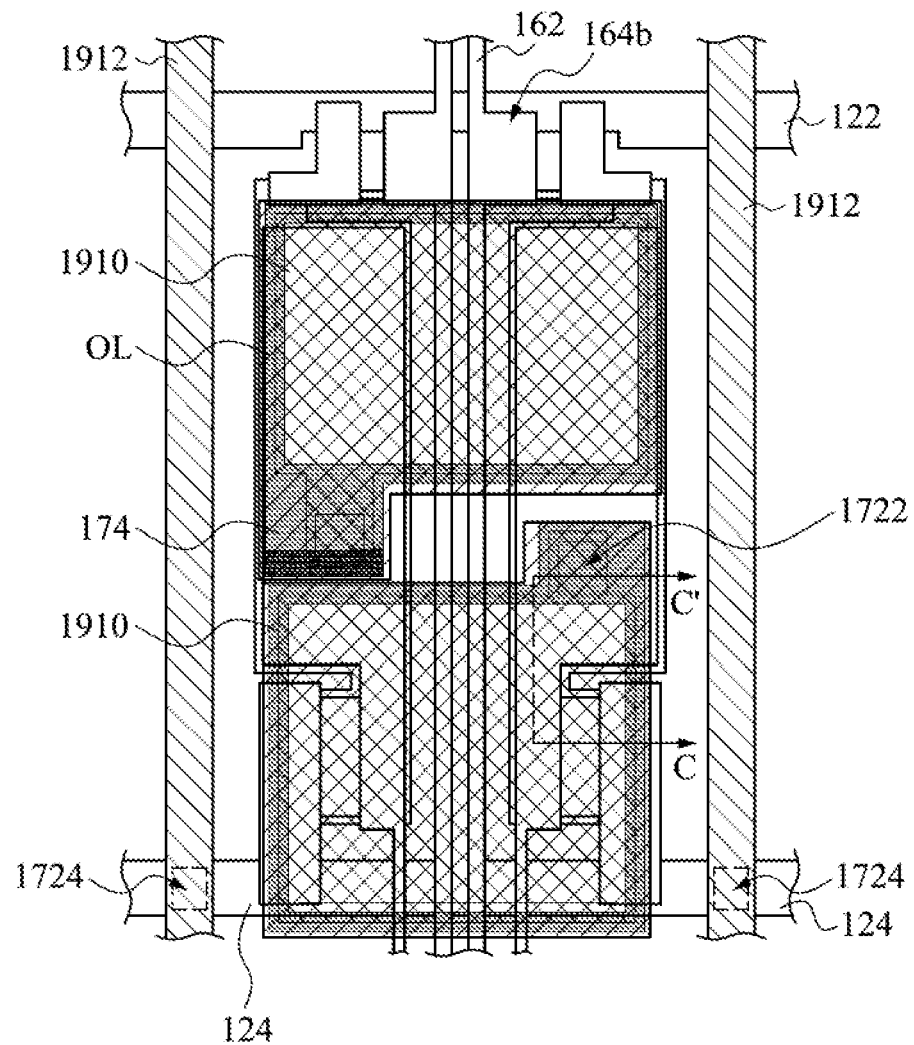
Figure 10B:
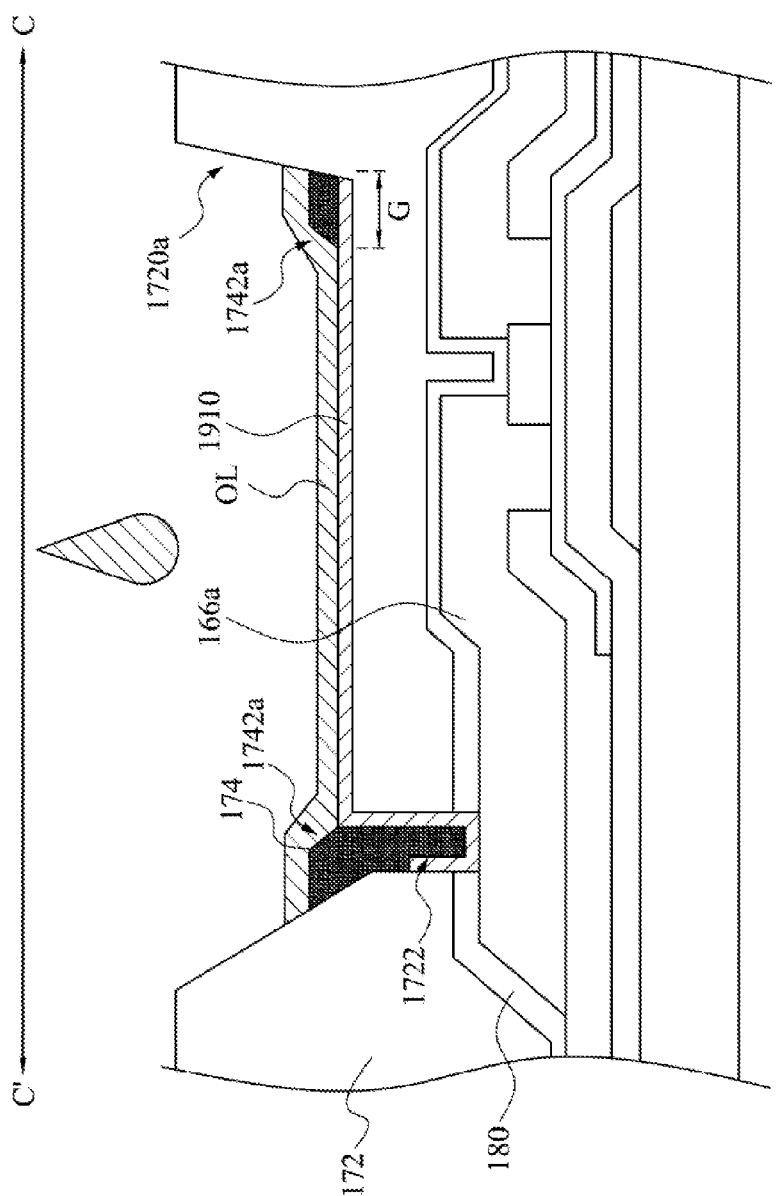

FIG. 10B is the cross-section view of FIG. 10A along the line C-C'. Then, with reference to FIG. 10A and FIG. 10B, form the color layer OL on the first electrode 1910 by ink jet printing process for example. The color layer OL comprises organic emission layer, for example. The organic emission layer is located in the second concave 1742. Further, the organic emission layer may be, for example, located in the first concave 1720 and on the top surface of the second bank 174.

Specifically, the step of forming the first bank 172 is before the step of forming the first electrode 1910, so the hydrophobic element(s) contained in the first bank 172 would not or hardly diffuse to the surface of the first electrode 1910. Because the surface of the first electrode 1910 is without or few hydrophobic element(s) located thereon, the color layer OL can uniformly spread within the sub-pixel region and have even thickness thereby the color layer OL is prevented from being degraded and longer lifetime of the device can be generated. Contrarily, if the hydrophobic bank is formed after the first electrode, hydrophobic element(s) contained in the bank would be uncontrolled and unexpected to diffuse to the first electrode such that air may be formed between the surfaces of the color layer OL and the first electrode adjacent thereto.

Besides, the second bank 174 has a hydrophilic frame structure and has width of about 3 micrometers to about 5 micrometers thereby better adhesion between the color layer OL and side walls of the first concave 1720 or the second concave 1742 can be achieved.

Figure 10C:
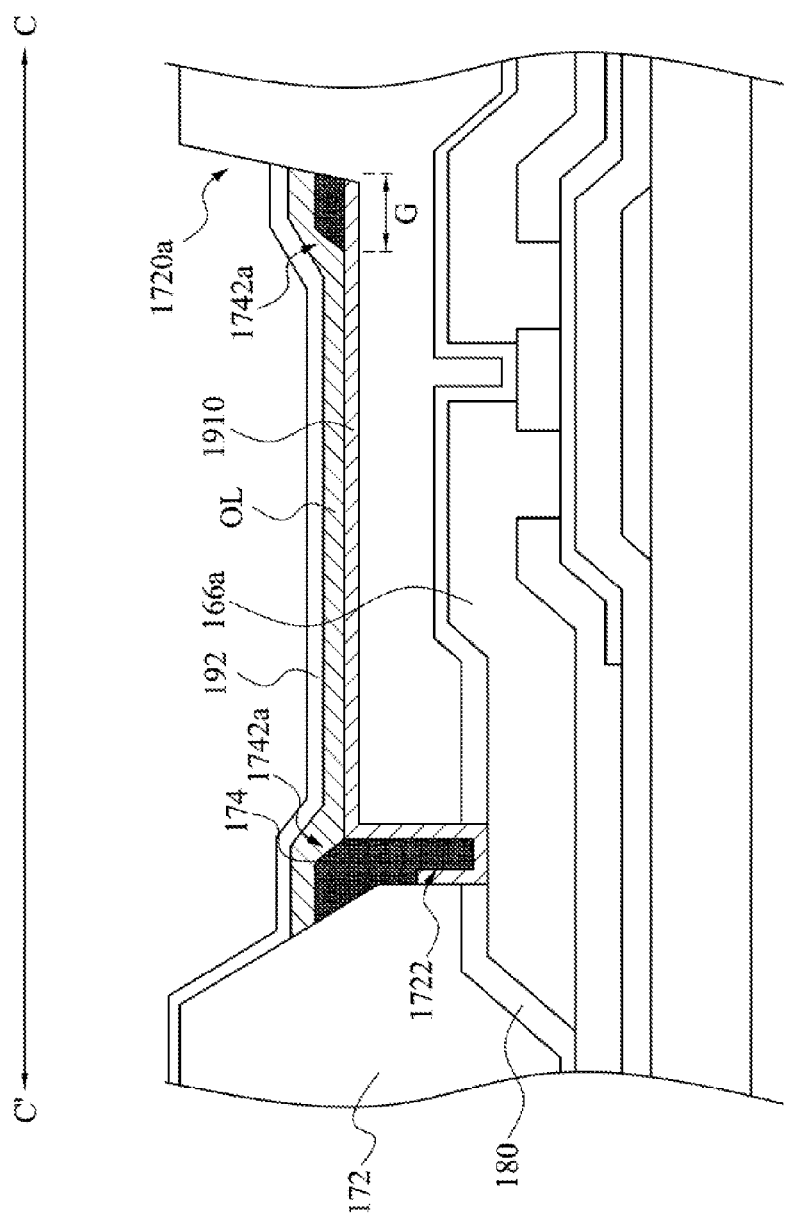

After the step of forming the color layer OL, form the second electrode 192 on the color layer OL as shown in FIG. 10C. The material of the second electrode 192 comprises Indium Tin Oxide (ITO), indium zinc oxide (IZO), Zinc oxide (ZnO), aluminium doped zinc oxide (AZO). The first electrode 1910, the color layer OL and the second electrode 192 constitute the emitting diode. The first electrode 1910 is served as an anode, and the second electrode 192 is served as a cathode, for example. As explained above, the array substrate of one embodiment of the present invention of an organic light emitting diode display is manufactured completely. The organic light emitting diode display of the present embodiment includes the first substrate, the thin film transistor array formed on the first substrate 110, the first electrodes 1910, the first bank 172, the second bank(s) 174, the color layers OL, the second electrode(s) 192.

FIG. 11A to FIG. 14B are schematic cross-section views and representative corresponding top views of one pixel of the array substrate of a liquid crystal display of the process flow illustrating the manufacturing method of one embodiment of the invention.

Figure 11A:
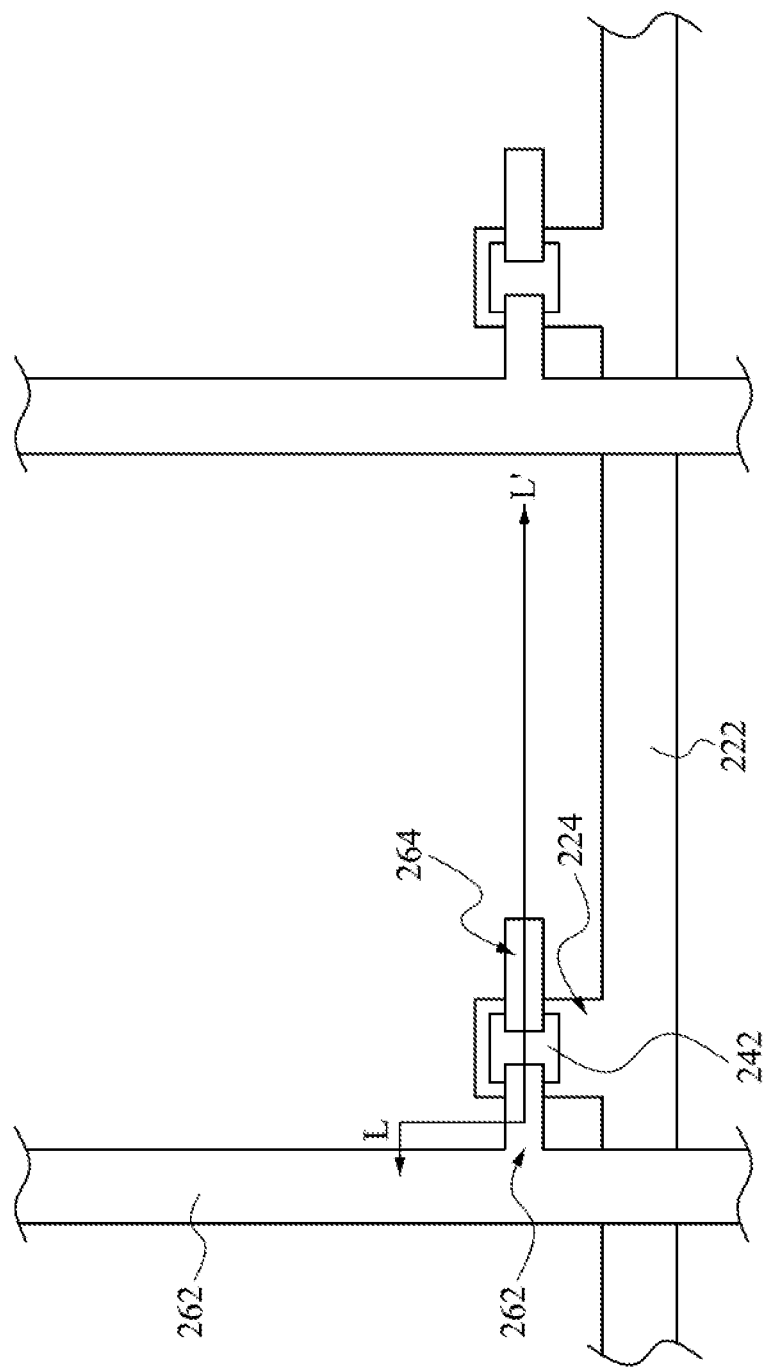
FIG. 11A to FIG. 14C are schematic cross-section views and representative corresponding top views of one pixel of the array substrate of a liquid crystal display of the process flow illustrating the manufacturing method of one embodiment of the present invention.
Figure 11B:
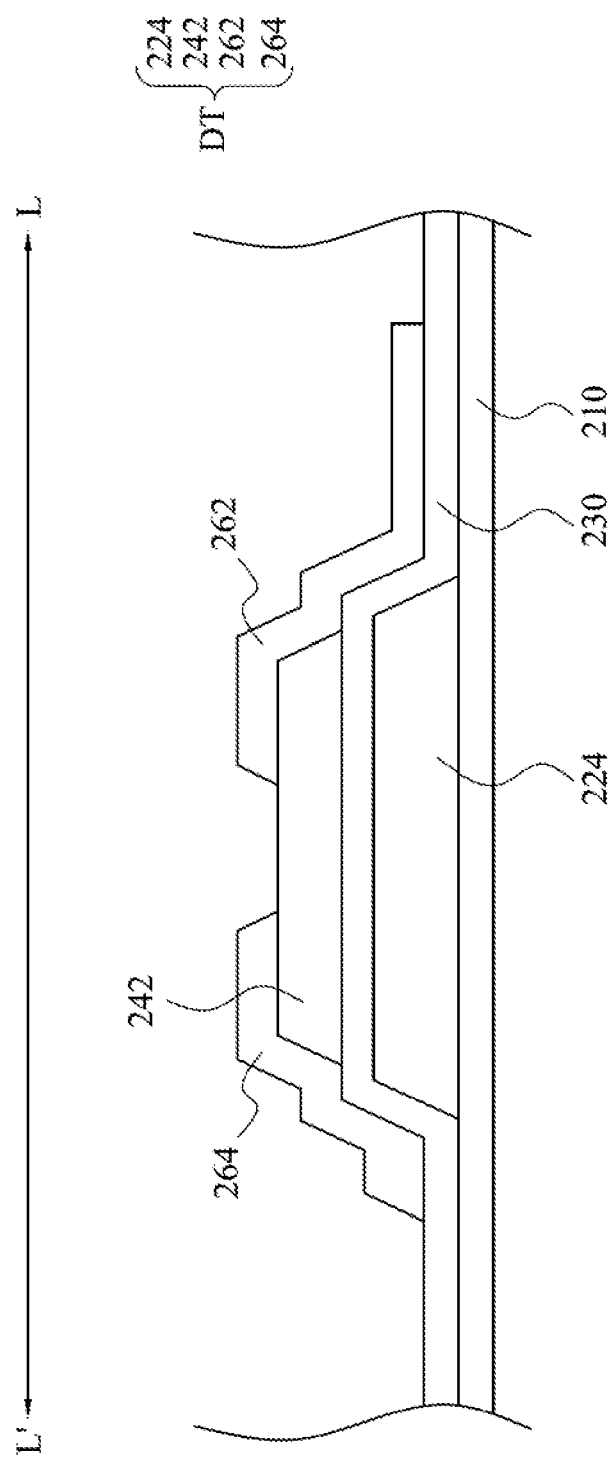

FIG. 11A is the top view of the thin film transistor array of the present embodiment. FIG. 11B is the cross-section view of FIG. 11A along the line L-L'. With reference to FIG. 11A and FIG. 11B, form a thin film transistor array on the first substrate 210. The method of manufacturing the thin film transistor array can be referred to previous embodiment, and detail description is omitted but not limited thereto. In FIG. 11A, only one pixel is shown for purpose of explanation and clear observation, and not limitation. The thin film transistor array includes scan lines 222, data lines 262, driving thin film transistors DT electrically connected with corresponding scan line 222 and data line 262 respectively. The driving thin film transistors DT includes gate 224, channel layer 242, source 262 and drain 264. The gate insulating layer 230 is formed between the gate 224 and the channel layer 242. Source 262 of the driving thin film transistors DT is electrically connected with the corresponding data line 262, and the gate 224 is electrically connected with the corresponding scan line 222.

Figure 12A:
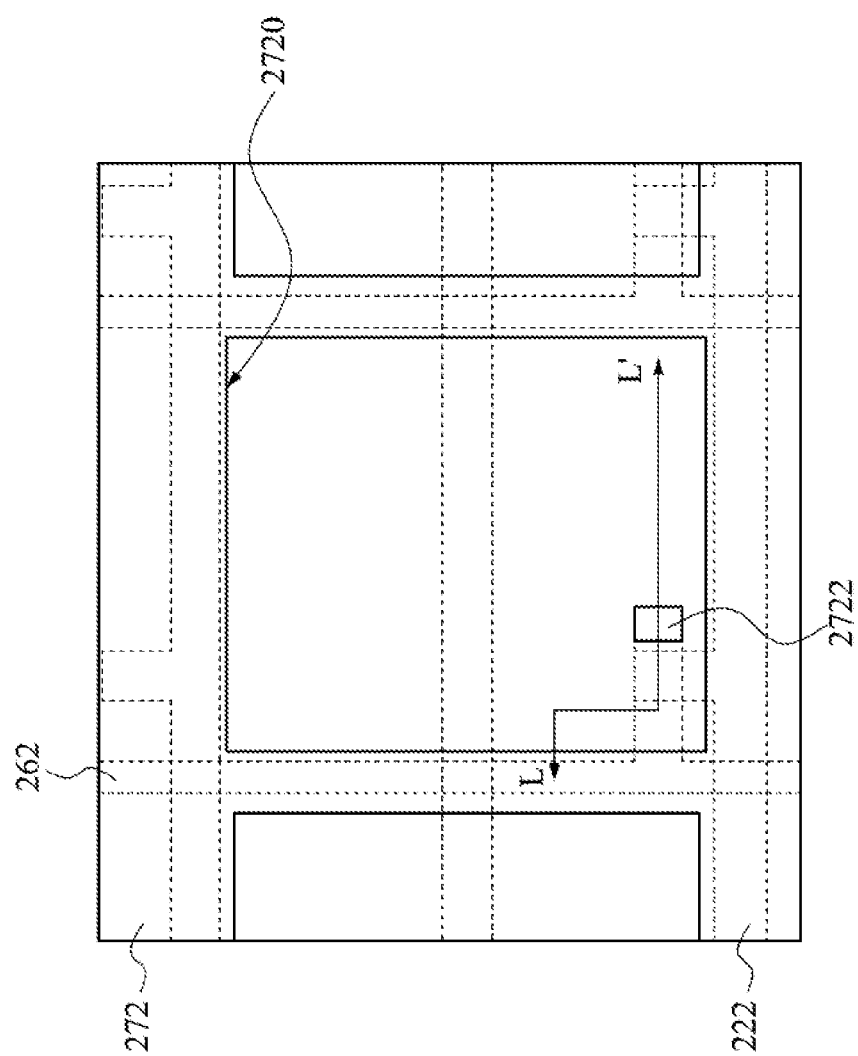
Figure 12B:
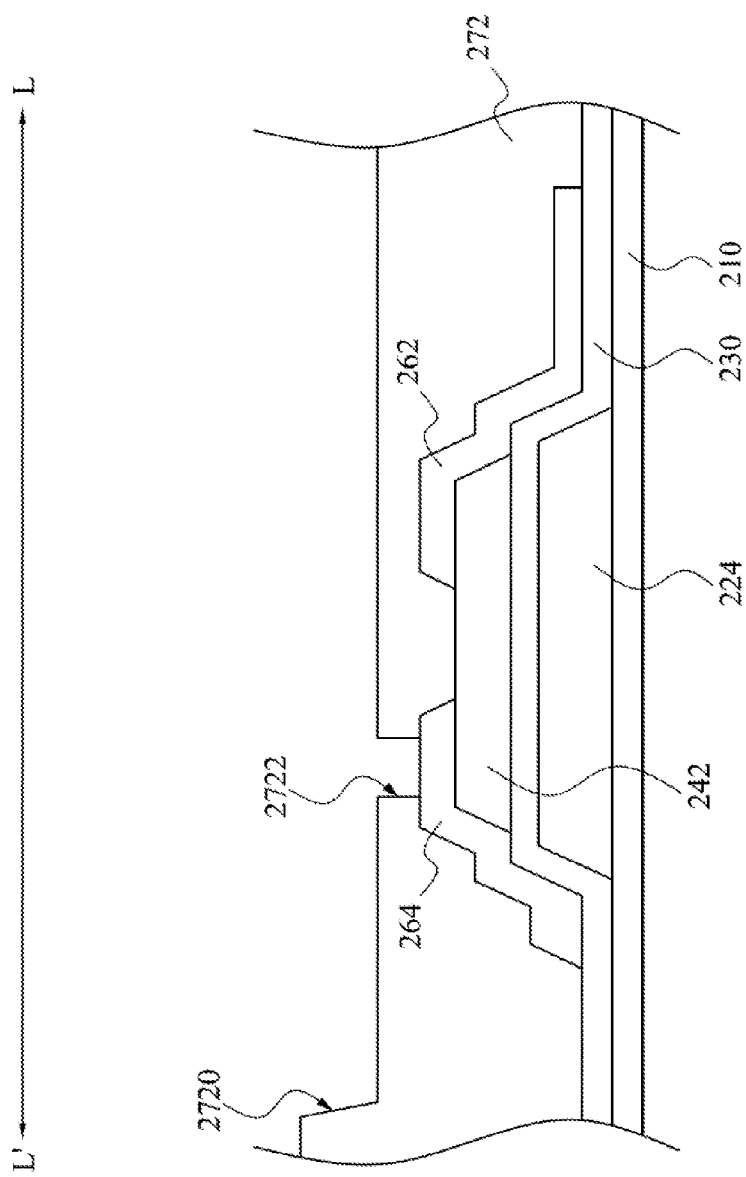

Thereafter, with reference to FIG. 12A and FIG. 12B, form the first bank material layer (not marked and shown) on the thin film transistor array. The step of form the first bank material layer can be referred to the corresponding step of the previous embodiment, but not limited thereto. The first bank material layer may comprise black resist, for example. In order to define the sub-pixel areas properly, the material of the first bank material layer comprises hydrophobic element and organic material. The hydrophobic element may be fluorine. The organic material comprises positive photoresist or negative photoresist. Then, pattern the first bank material layer to form the first bank 272. The step of patterning the first bank material layer to form the first bank 272 can be referred to the corresponding step of the previous embodiment, but not limited thereto. The first bank 272 has the first concave 2720 corresponding to sub-pixel region, and has the contact hole 2722 to expose the drain 264. In detail, the first bank 272 has first concaves 2720 corresponding to sub-pixel regions, respectively.

Figure 13A:
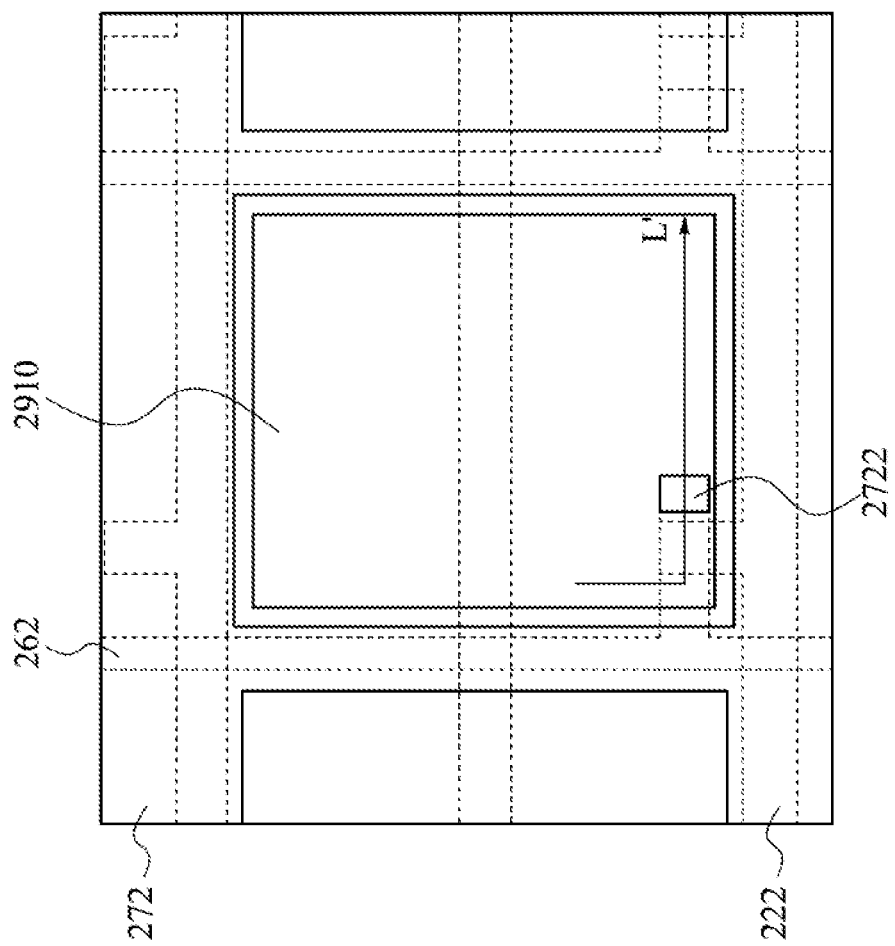
Figure 13B:
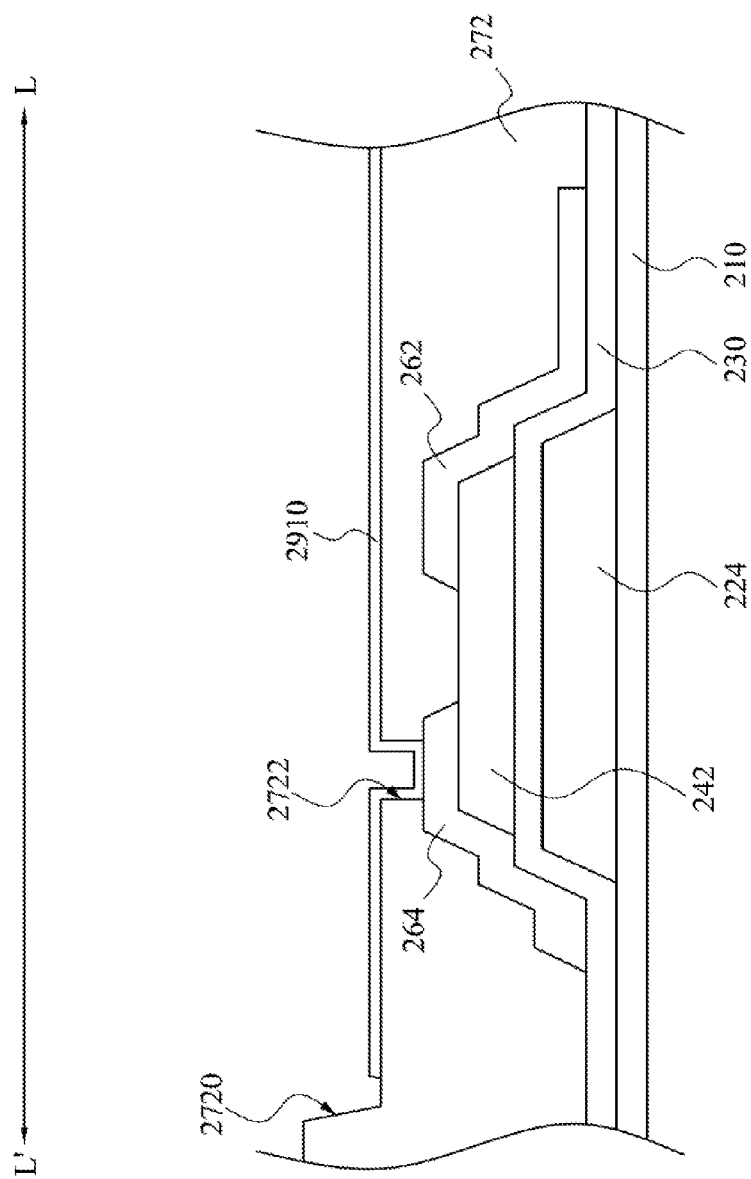

Then, with reference to FIG. 13A and FIG. 13B, form the first electrode 2910 on the first bank 272 and electrically connected with the drain 264. The first electrode 2910 is served as the pixel electrode. In the present embodiment, the first electrode 2910 is completely within the first concave 2720 of the first bank 272. However, there is not limitation, in one embodiment, the first electrode 2910 may be extended from the bottom of the first concave 2720 to the top surface of the first bank 272, in other words, the contour of the first concave 2720 is completely within that of the first electrode 2910.

Figure 14A:
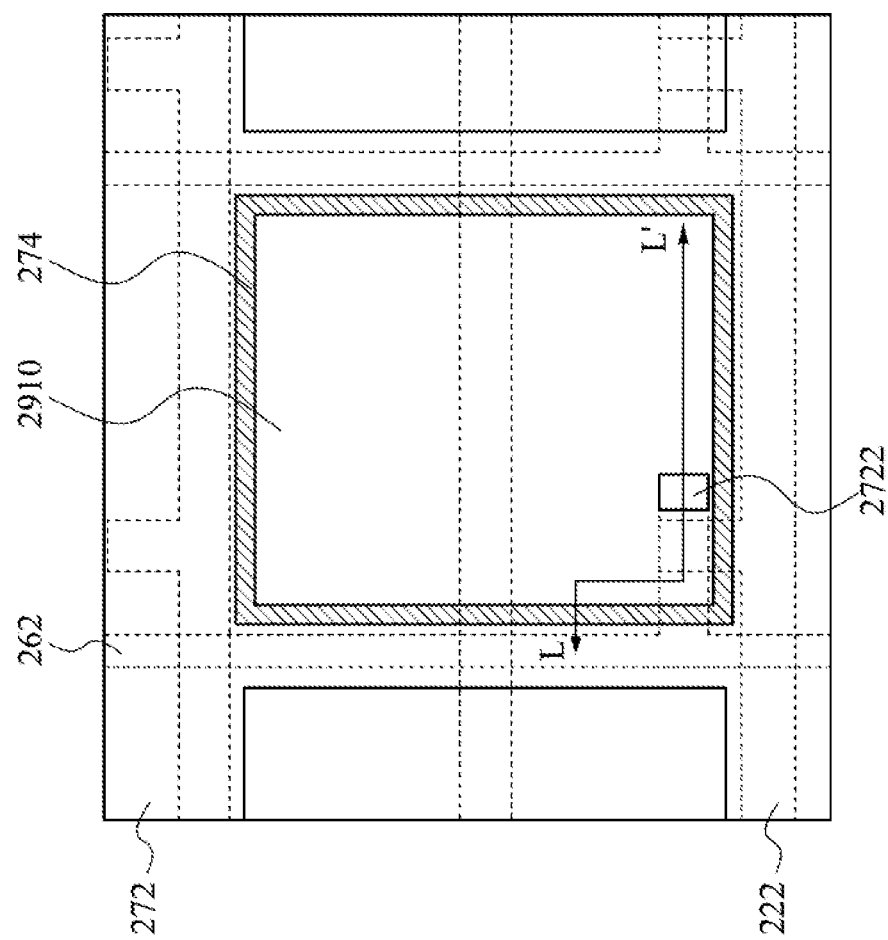
Figure 14B:
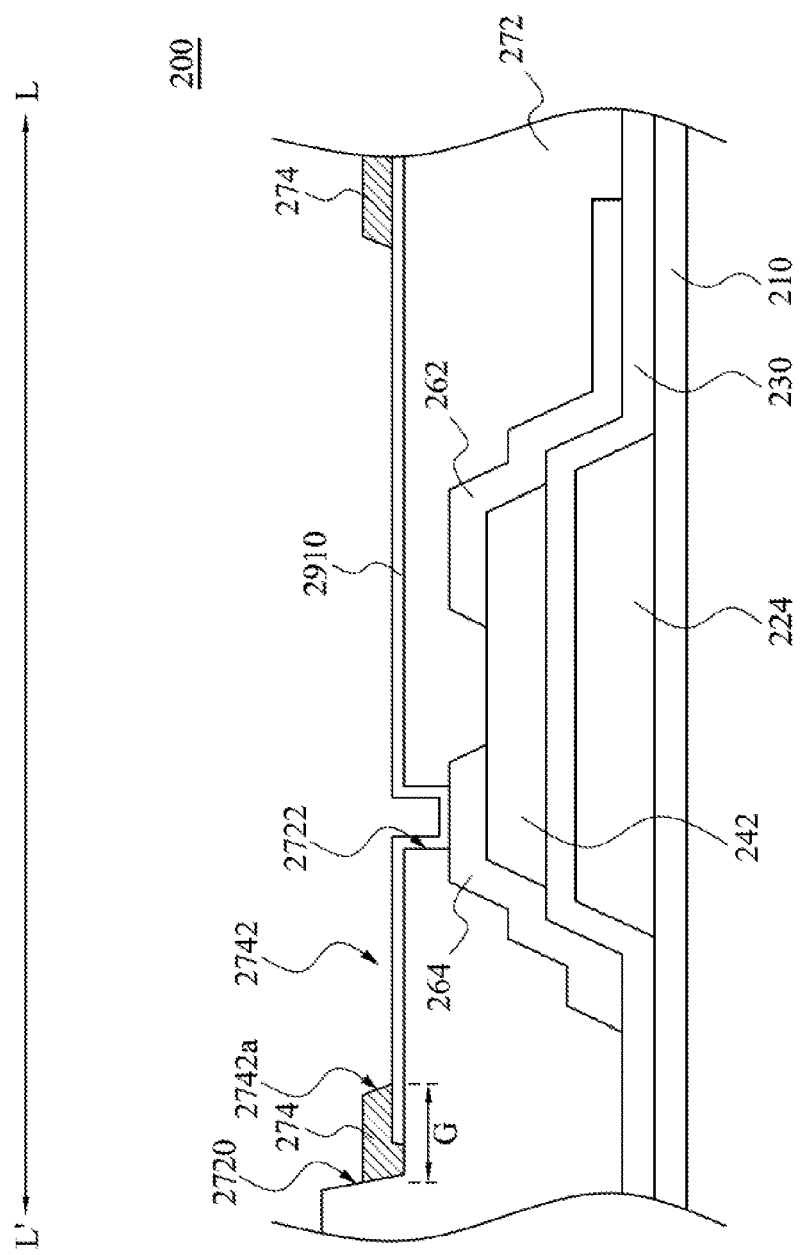

After that, with reference to FIG. 14A and FIG. 14B, form the second bank material layer (not marked) on the first electrode 2910. The material of the second bank material layer comprises hydrophilic element. As shown in FIG. 14A, pattern the second bank material layer to form the second bank 274. The second bank 274 may include a shape of rectangle or circle, but not limited thereto. Similar to the previous embodiment and FIG. 9B, the second bank 274 has a second concave 2742 which is completely within the first concave 2720, for example. With reference to FIG. 14B, horizontal distance G between the edge 2742a of the second concave 2742 and the edge 2720a of the first concave 2720 is about 3 micrometers to about 5 micrometers. That is, the width of the second bank 274 is about 3 micrometers to about 5 micrometers.

Figure 14C:
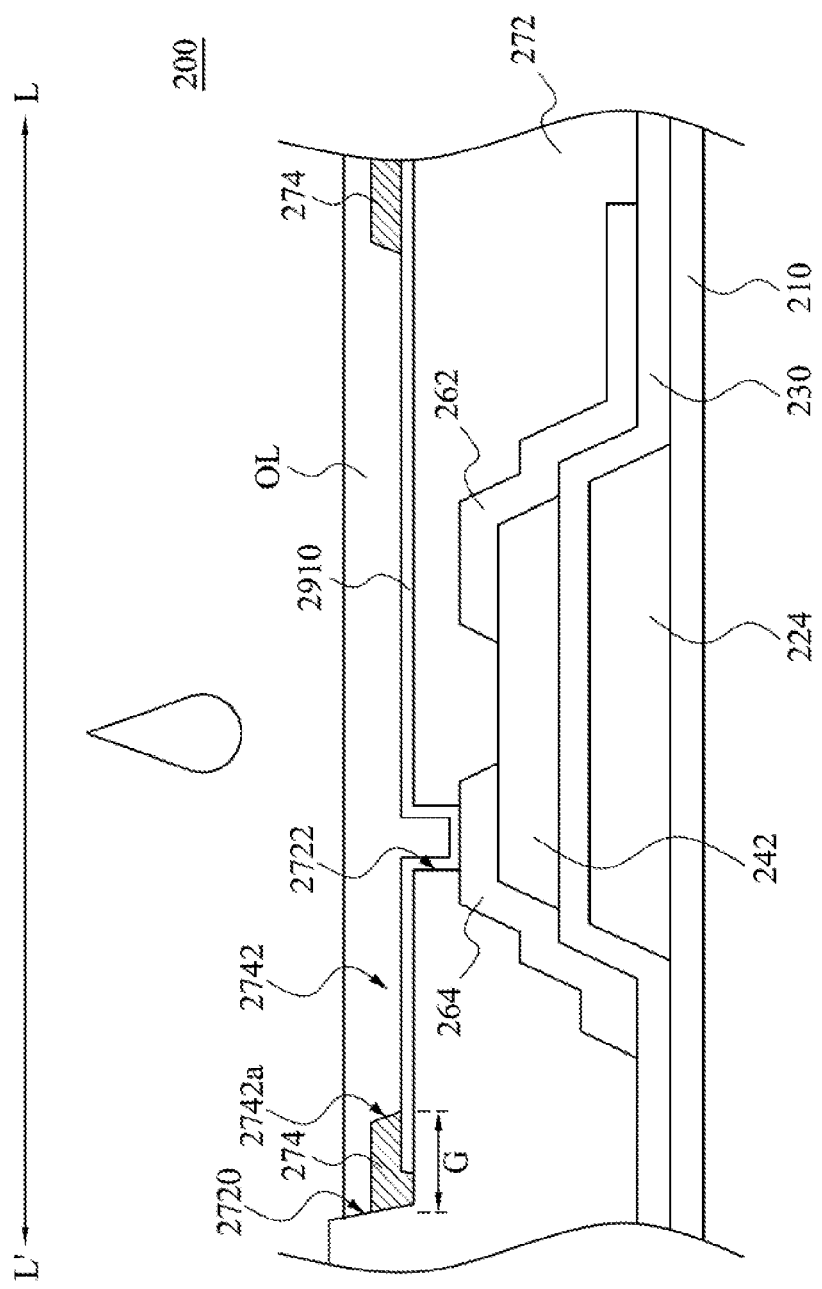

Then, as shown in FIG. 14C, form the color layer OL on the first electrode 2910 by ink jet printing process for example. The color layer OL comprises red color filter, green color filter or blue color filter. The material of the color layer OL comprises pigment or dye, for example. The color layer OL is located in the second concave 2742.

Specifically, the step of forming the first bank 272 is before the step of forming the first electrode 2910, so the hydrophobic element(s) contained in the first bank 272 would not or hardly diffuse to the surface of the first electrode 2910. Because the surface of the first electrode 2910 is without or few hydrophobic element(s) located thereon, the color layer OL can uniformly spread within the sub-pixel region and have even thickness thereby the color layer OL is prevented from being degraded and longer lifetime of the device can be generated. Besides, because of the second bank 274 which is hydrophilic, when ink-jet printing process is conducted, the ink coverage may be improved and controlled easily. Contrarily, if the hydrophobic bank is formed after the first electrode, hydrophobic element(s) contained in the bank would be uncontrolled and unexpected to diffuse to the first electrode such that air may be formed between the surfaces of the color layer OL and the first electrode adjacent thereto. Besides, the second bank 274 has a hydrophilic frame structure and has width of about 3 to 5 micrometers thereby better adhesion between the color layer OL and side walls of the first concave 2720 or the second concave 2742 can be achieved.

As explained above, the array substrate 200 of one embodiment of the present invention of a liquid crystal display is manufactured completely. The array substrate 200 is so-called COA substrate. The array substrate 200 includes the first substrate 210, driving thin film transistors DT, scan lines 222, data lines 262, first bank 272, second bank(s) 274, color layers OL, first electrodes 2910.

Figure 15:
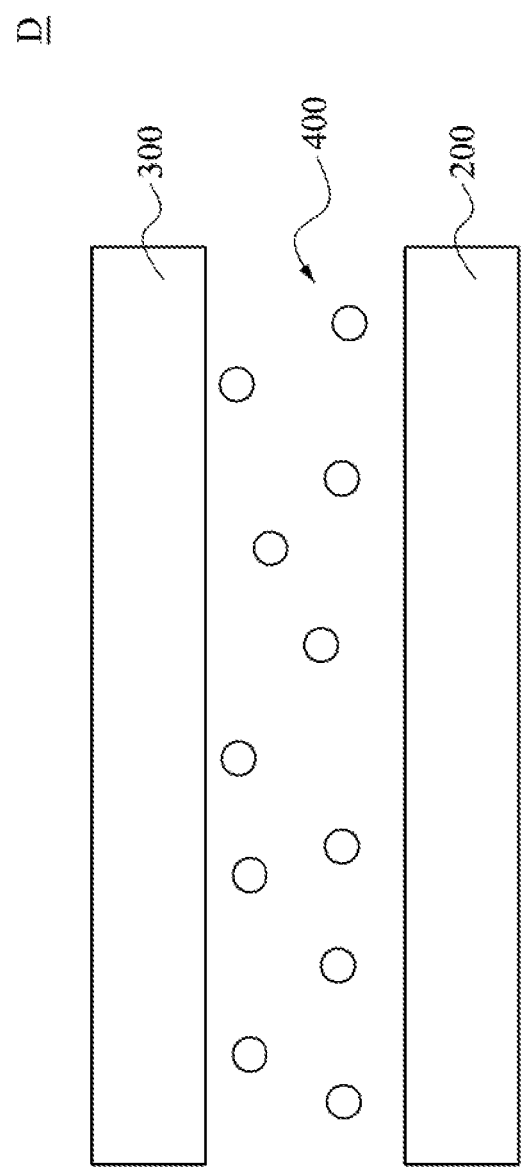
FIG. 15 is liquid crystal display according to one embodiment of the present invention.

FIG. 15 is the liquid crystal display according to one embodiment of the present invention. The liquid crystal display D includes array substrate 200, opposite substrate 300 and the liquid crystal layer 400 disposed therebetween. Further, protection layer (not shown) or/and alignment layer (not shown) may be formed on the array substrate 200 and adjacent to the liquid crystal layer 400, and a common electrode (not shown) or/and alignment layer (not shown) may be formed on the opposite substrate 300 and adjacent to the liquid crystal layer 400, but not limited thereto.

The present invention may suitably comprise, consist of, or consist essentially of, any of element, part, or feature of the invention and their equivalents. Further, the present invention illustratively disclosed herein may be practiced in the absence of any element; whether or not specifically disclosed herein. Obviously, numerous modifications and variations of the present invention are possible in light of the above teachings. It is therefore to be understood that within the scope of the appended claims, the invention may be practiced otherwise than as specifically described herein.

What is claimed is:
1. A method of manufacturing an array substrate, comprising:
   forming a thin film transistor on a first substrate;
   forming a first bank material layer on the thin film transistor, wherein a material of the first bank material layer comprises a hydrophobic element;
   patterning the first bank material layer to form a first bank having a first concave and a contact hole, wherein the contact hole is located above a drain of the thin film transistor;
   forming a first electrode on the first bank and in the first concave after the step of patterning the first bank material layer to form the first bank, wherein a portion of the first electrode is in the contact hole;
   forming a second bank material layer on the first electrode, in the contact hole, and in the first concave; and
   forming a color layer on the first electrode and touching the first bank;

wherein the first bank is hydrophobic so that the color layer does not overflow during the step of forming the color layer.

2. The method according to claim 1, wherein the color layer comprises an organic emission layer, a material of the second bank material layer comprises a hydrophilic element and wherein the method further comprises:
   patterning the second bank material layer to form a second bank having a second concave; and
   forming a second electrode on the organic emission layer, wherein the organic emission layer is located in the second concave.

3. The method according to claim 2, wherein the second bank substantially surrounds the color layer.

4. The method according to claim 2, wherein a material of the first electrode comprises aluminium Neodymium (AlNd), Indium Tin Oxide (ITO), Titanium (Ti), Aluminium (Al), or silver (Ag), and a material of the second electrode comprises Indium Tin Oxide (ITO), indium zinc oxide (IZO), Zinc oxide (ZnO), aluminium doped zinc oxide (AZO).

5. The method according to claim 2, further comprising:
   disposing a mask above the first bank material layer located on the thin film transistor, wherein the step of patterning the first bank material layer is utilizing the mask to remove a portion of the first bank material layer to form the first concave and the contact hole located above the drain of the thin film transistor;
   wherein, the thin film transistor is a driving thin film transistor.

6. The method according to claim 5, wherein the mask is a half-tone mask or a grey-tone mask.

7. The method according to claim 5, further comprising:
   forming a passivation layer on the driving thin film transistor before the step of forming the first bank material layer on the first substrate; and
   patterning the passivation layer to form an opening to expose the drain of the driving thin film transistor, wherein the opening and the contact hole of the first bank are connected with each other.

8. The method according to claim 5, wherein the first electrode is electrically connected with the drain of the driving thin film transistor.

9. The method according to claim 2, wherein a horizontal distance between an edge of the second concave and that of the first concave is about 3 micrometer to about 5 micrometer.

10. The method according to claim 9, wherein the second bank is completely within the first concave.

11. The method according to claim 2, wherein the hydrophobic element comprises fluorine.

12. The method according to claim 1, wherein the color layer comprises a red color filter, a green color filter or a blue color filter.

* * * * *